(12) United States Patent
Muraki

(10) Patent No.: US 6,566,664 B2
(45) Date of Patent: May 20, 2003

(54) CHARGED-PARTICLE BEAM EXPOSURE APPARATUS AND DEVICE MANUFACTURING METHOD

(75) Inventor: Masato Muraki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/808,175

(22) Filed: Mar. 15, 2000

(65) Prior Publication Data

US 2003/0066974 A1 Apr. 10, 2003

(30) Foreign Application Priority Data

Mar. 17, 2000 (JP) ........................................ 2000-075894
May 23, 2000 (JP) ........................................ 2000-151356

(51) Int. Cl.$^7$ .............................. A61N 5/00; G21G 5/00
(52) U.S. Cl. ................................................... 250/492.2
(58) Field of Search ........................ 250/492.2, 492.22, 250/491.1

(56) References Cited

U.S. PATENT DOCUMENTS

| | | | |
|---|---|---|---|
| 4,544,847 A | * 10/1985 | Taylor | 250/396 ML |
| 5,834,783 A | 11/1998 | Muraki et al. | 250/398 |
| 5,905,267 A | 5/1999 | Muraki | 250/492.22 |
| 5,939,725 A | 8/1999 | Muraki | 250/492.22 |
| 6,054,713 A | 4/2000 | Miyake et al. | 250/492.22 |
| 6,104,035 A | 8/2000 | Muraki | 250/492.22 |
| 6,107,636 A | 8/2000 | Muraki | 250/492.2 |
| 6,124,599 A | 9/2000 | Muraki | 250/492.22 |
| 6,137,111 A | * 10/2000 | Yamada et al. | 250/492.2 |
| 6,137,113 A | * 10/2000 | Muraki | 250/492.2 |
| 6,222,195 B1 | * 4/2001 | Yamada et al. | 250/492.2 |

FOREIGN PATENT DOCUMENTS

| | | |
|---|---|---|
| JP | 9-248708 | 9/1997 |
| JP | 9-288991 | 11/1997 |

* cited by examiner

Primary Examiner—Jack Berman
Assistant Examiner—Johnnie L Smith, II
(74) Attorney, Agent, or Firm—Fitzpatrick, Cella, Harper & Scinto

(57) ABSTRACT

A charged-particle beam exposure apparatus splits a charged-particle beam from a charged-particle source into a plurality of charged-particle beams. Element electrooptic systems form intermediate images of the charged-particle source by these charged-particle beams. A projection optical system projects the intermediate images generated by the element electrooptic systems on a surface to be exposed, such as a wafer. This charged-particle beam exposure apparatus employs a mechanism of adjusting the incident angles of the charged-particle beams incident on the element electrooptic systems in order to adjust positions where the intermediate images are projected on the surface to be exposed. As a result, varied distortion is effectively corrected.

38 Claims, 25 Drawing Sheets

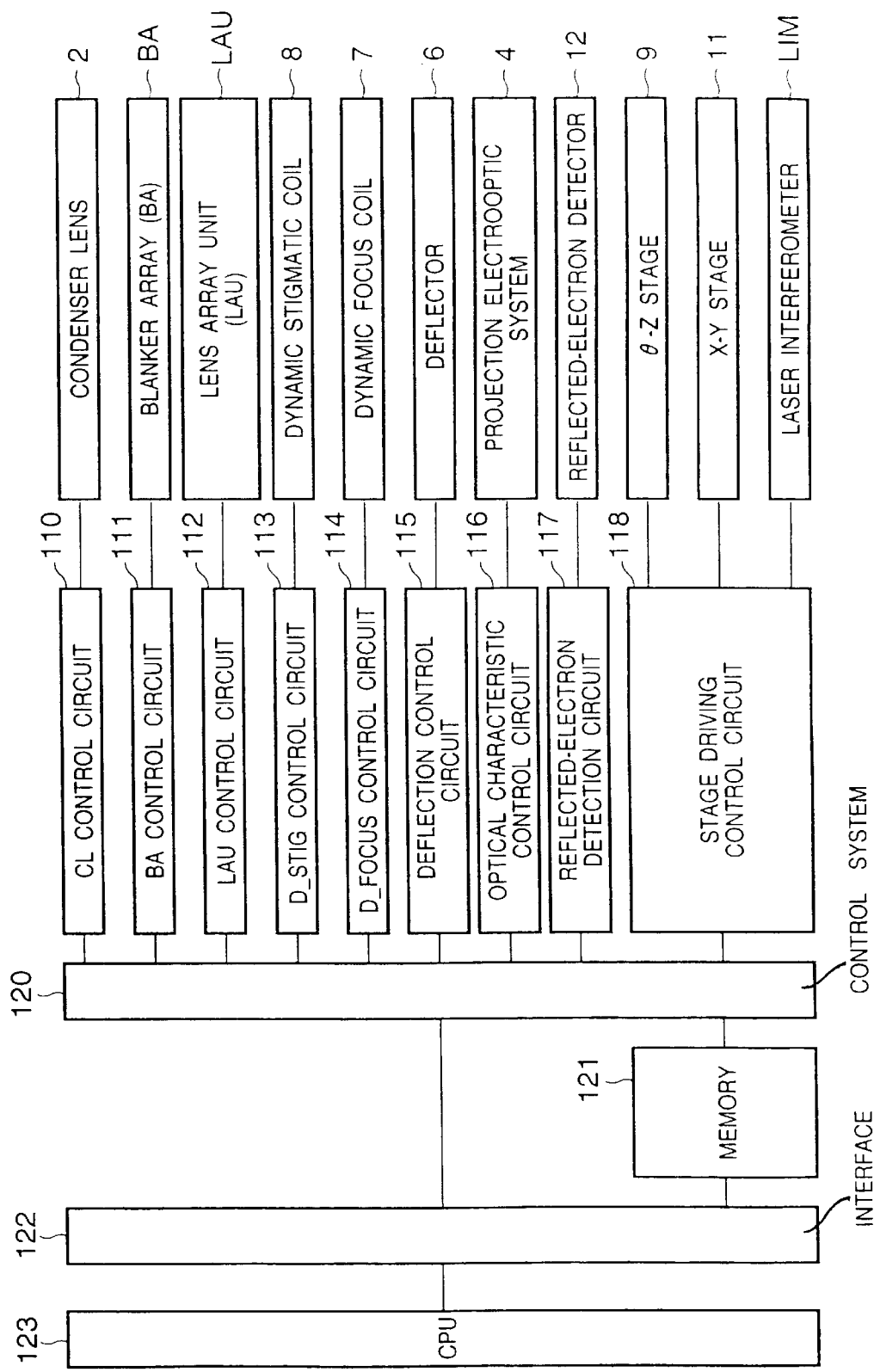

FIG. 12A
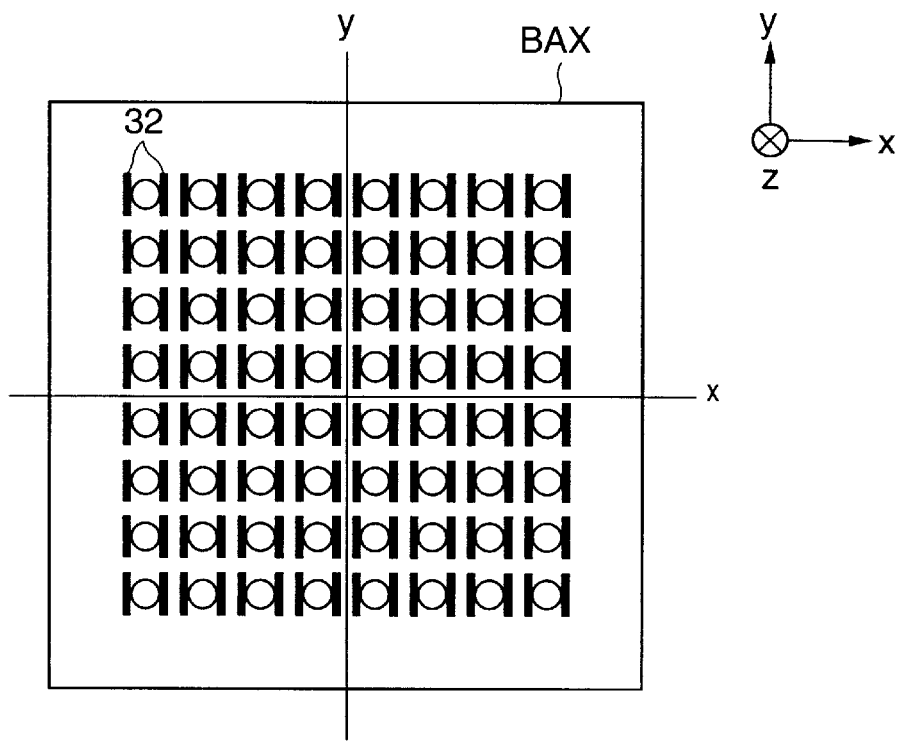
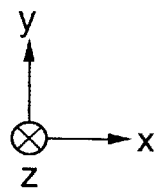
FIG. 12B
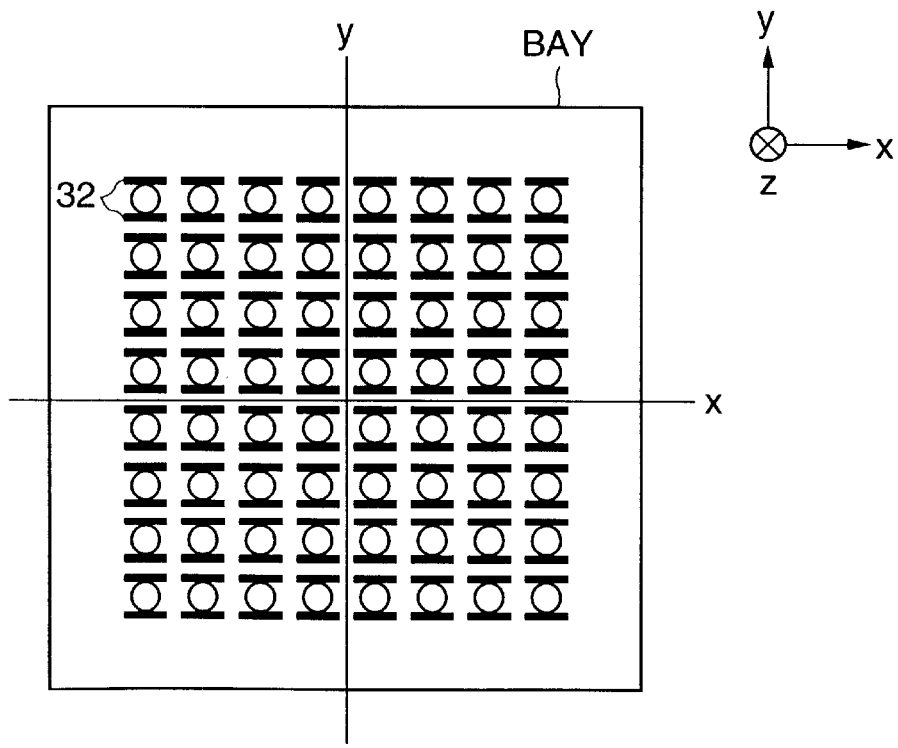
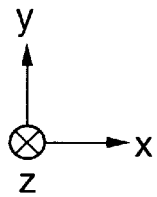

FIG. 22

| | |
|---|---|
| URL | http://www.maintain.co.jp/db/input.html |

TROUBLE DB INPUT WINDOW

OCCURRENCE DATE 2000/3/15 ~404
TYPE OF APPARATUS * * * * * * * * * * ~401
SUBJECT OPERATING ERROR (START-UP ERROR) ~403
SERIAL NUMBER S/N 465NS4580001 ~402
DEGREE OF URGENCY D ~405
SYMPTOM LED IS KEPT FLICKERING AFTER POWER-ON ~406
REMEDY POWER ON AGAIN (PRESS RED BUTTON IN ACTIVATION) ~407
PROGRESS INTERIM HAS BEEN DONE ~408

(SEND) (RESET)    410                    411                412
LINK TO RESULT LIST DATABASE   SOFTWARE LIBRARY   OPERATING GUIDE

CHARGED-PARTICLE BEAM EXPOSURE APPARATUS AND DEVICE MANUFACTURING METHOD

FIELD OF THE INVENTION

The present invention relates to a charged-particle beam exposure apparatus such as an electron beam exposure apparatus or ion beam exposure apparatus used to expose a semiconductor integrated circuit or the like and, more particularly, to a charged-particle beam exposure apparatus for drawing a pattern by using a plurality of charged-particle beams, and a device manufacturing method using this apparatus.

BACKGROUND OF THE INVENTION

Multi charged-particle beam exposure apparatuses using a plurality of charged-particle beams include electron beam exposure apparatuses disclosed in Japanese Patent Laid-Open Nos. 9-248708 and 9-288991. FIG. 25 is a schematic view of such an apparatus.

In FIG. 25, an electron beam from an electron source ES which emits electrons is almost collimated by a collimator lens CL. The almost collimated beam enters an aperture array AA having a plurality of apertures where the beam is split into a plurality of electron beams. The split electron beams enter element electrooptic systems EL1 to EL3 and form intermediate images img1 to img3 of the electron source ES on the almost front focal positions of the respective element electrooptic systems. The intermediate images are projected on a wafer W as a surface to be exposed via a projection electrooptic system DO. At this time, the electron beams of the intermediate images scan the surface of the wafer W via a common deflector. Blankers B1 to B3 and stoppers S1 to S3 separately control irradiation of the respective electron beams on the wafer W, and a pattern is drawn on the wafer W.

As the feature of this apparatus, the optical characteristics of the element electrooptic systems are individually set for the curvature of field (deviation between an actual imaging position and an ideal imaging position on the wafer W along the optical axis of the projection electrooptic system DO), and the intermediate image formation position along the optical axis is changed for each element electrooptic system so as to correct the curvature of field, in order to correct aberration generated when a plurality of intermediate images are projected on a surface to be exposed via the projection electrooptic system DO. For distortion (deviation between an actual imaging position and an ideal imaging position on the wafer W in directions perpendicular to the optical axis of the projection electrooptic system DO), the element electrooptic systems are located at positions where distortion is corrected.

Aberration of the projection electrooptic system DO varies owing to thermal/mechanical deformation of the projection electrooptic system DO. It is easy to electrically reset the optical characteristics of the element electrooptic systems in correspondence with varied curvature of field. However, it is difficult in terms of precision to mechanically relocate each element electrooptic system in correspondence with varied distortion.

SUMMARY OF THE INVENTION

The present invention has been made to overcome the conventional drawbacks, and has as its object to provide a charged-particle beam exposure apparatus capable of easily correcting distortion of a projection electrooptic system.

It is another object of the present invention to enable obtaining a higher-precision device than a conventional device by manufacturing the device by using the charged-particle beam exposure apparatus which achieves the above object.

To achieve the above objects, according to the present invention, there is provided a charged-particle beam exposure apparatus for exposing a surface to be exposed by using a plurality of charged-particle beams, comprising a charged-particle source for emitting a charged-particle beam, a substrate having a plurality of apertures, an irradiation electrooptic system for irradiating the substrate with the charged-particle beam emitted by the charged-particle source, element electrooptic systems for forming a plurality of intermediate images of the charged-particle source by forming the intermediate images of the charged-particle source by charged-particle beams having passed through the apertures of the substrate, a projection electrooptic system for projecting the plurality of intermediate images on the surface to be exposed, and adjustment means for adjusting incident angles of the charged-particle beams incident on the element electrooptic systems in order to adjust positions where the plurality of intermediate images are projected on the surface to be exposed.

It is preferable that the apparatus further comprise information acquisition means for obtaining information about the positions where the plurality of intermediate images are projected on the surface to be exposed, and the adjustment means adjust the incident angles of the charged-particle beams incident on the element electrooptic systems on the basis of the information. This is because distortion can be properly corrected in accordance with the electrooptic system.

According to another aspect of the present invention, the adjustment means adjusts the incident angles to move formation positions of the plurality of intermediate images in a direction parallel to a surface perpendicular to an optical axis of the projection electrooptic system.

Another aspect of the adjustment means adjusts the incident angles by changing a positional relationship between a front focal position of the irradiation electrooptic system and a position of the charged-particle source. Adjustment is easy because of a small number of control targets (adjustment targets), and systematic distortion (distortion of the projection electrooptic system) can be corrected.

It is preferable that the irradiation electrooptic system has a plurality of electron lenses, and the adjustment means changes the front focal position by adjusting electrooptic powers of at least two electron lenses of the irradiation electrooptic system. Since distortion can be corrected by adjusting the electrooptic powers, easy, high-precision correction can be implemented.

It is also possible that the apparatus further comprises deflectors which are arranged in correspondence with the apertures of the substrate and deflect charged-particle beams from the apertures, and the adjustment means adjusts the incident angles by deflecting the charged-particle beams by using the deflectors. The number of adjustment items increases owing to a larger number of control targets (adjustment targets). However, both systematic distortion (distortion of the projection electrooptic system) and random distortion can be corrected, and higher-precision correction can be realized.

The deflectors preferably function as shielding deflectors for giving shielding deflection amounts to charged particles so as to prevent the charged particles from corresponding intermediate images from being incident on the projection electrooptic system. The construction can be simplified.

The adjustment means may comprise first adjustment means for adjusting the incident angles by changing a positional relationship between a front focal position of the irradiation electrooptic system and a position of the charged-particle source, and second adjustment means for adjusting the incident angles by deflecting charged-particle beams by using the deflectors.

When the adjustment means has the first and second adjustment means, it is also possible that the apparatus further comprises information acquisition means for obtaining information about the positions where the plurality of intermediate images are projected on the surface to be exposed via the projection electrooptic system, and that the adjustment means executes the first adjustment means on the basis of the information, newly acquires information from the information acquisition means after execution of the first adjustment means, and executes the second adjustment means on the basis of the newly acquired information. If distortion can be satisfactorily corrected by only the first adjustment means, the adjustment means does not execute the second adjustment means. This can shorten the processing time.

The present invention provides a method of controlling the charged-particle beam exposure apparatus. The present invention provides a device manufacturing method using the charged-particle beam exposure apparatus. Furthermore, the present invention provides a device manufacturing factory for implementing the device manufacturing method.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 is a block diagram for explaining the system configuration of the electron beam exposure apparatus according to the first embodiment;

FIGS. 12A and 12B are views for explaining X and Y blanker arrays BAX and BAY according to the second embodiment;

FIG. 22 is a view showing an example of a user interface;

DETAILED DESCRIPTION OF THE PREFERRED EMBODIMENTS

Preferred embodiments of the present invention will now be described in detail in accordance with the accompanying drawings.

The following embodiments will exemplify an electron beam exposure apparatus as an example of a charged-particle beam exposure apparatus, but the present invention can also be applied to a charged-particle beam exposure apparatus using an ion beam other than an electron beam.

First Embodiment

<Building Component of Electron Beam Exposure Apparatus>

Figure 1:
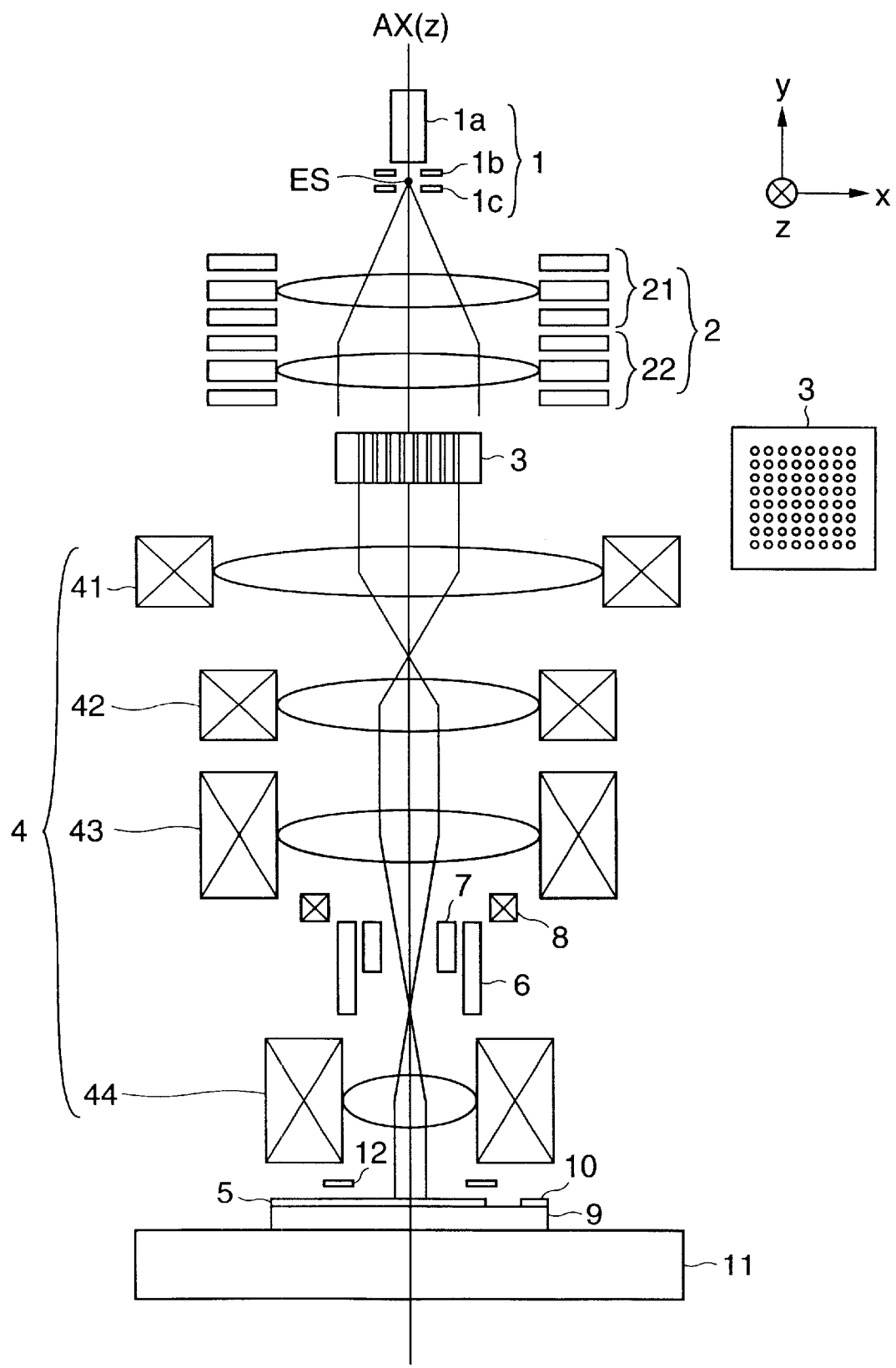
FIG. 1 is a schematic view showing the main part of an electron beam exposure apparatus according to the first embodiment.

FIG. 1 is a schematic view showing the main part of an electron beam exposure apparatus according to the present invention. In FIG. 1, an electron gun 1 as a charged-particle source is constituted by a cathode $1a$, grid $1b$, and anode $1c$. Electrons emitted by the cathode $1a$ form a crossover image (to be referred to as an electron source ES hereinafter) between the grid $1b$ and the anode $1c$. An electron beam emitted by the electron source ES irradiates a correction electrooptic system 3 via an irradiation electrooptic system 2 (to be referred to as a condenser lens 2 hereinafter). The irradiation electrooptic system 2 of the first embodiment is comprised of electron lenses (unipotential lenses) 21 and 22 each having three aperture electrodes.

Figure 2A:
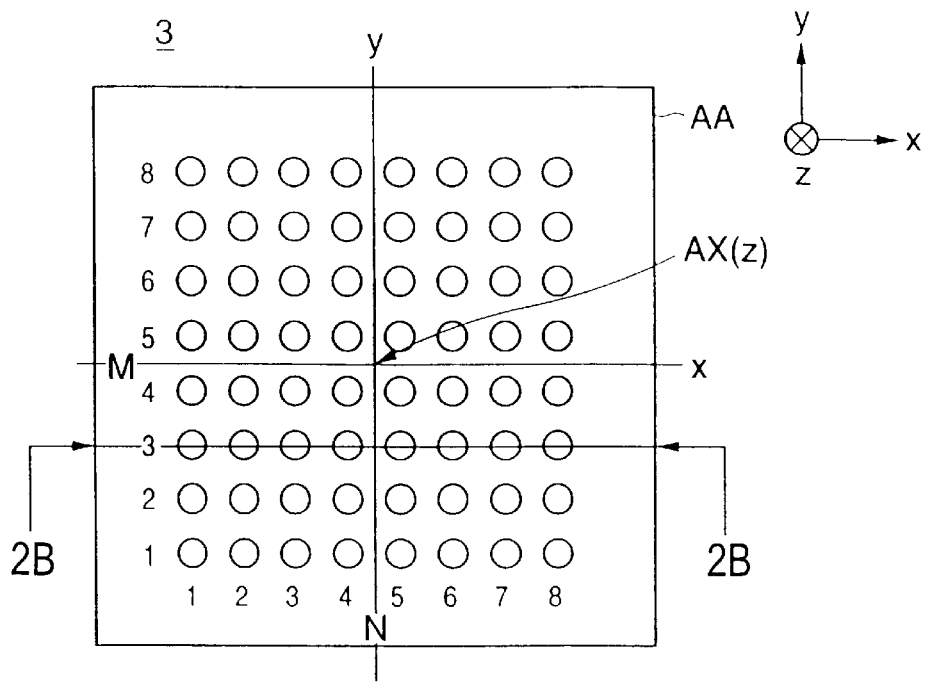
FIGS. 2A and 2B are views for explaining a correction electrooptic system according to the first embodiment.
Figure 2B:
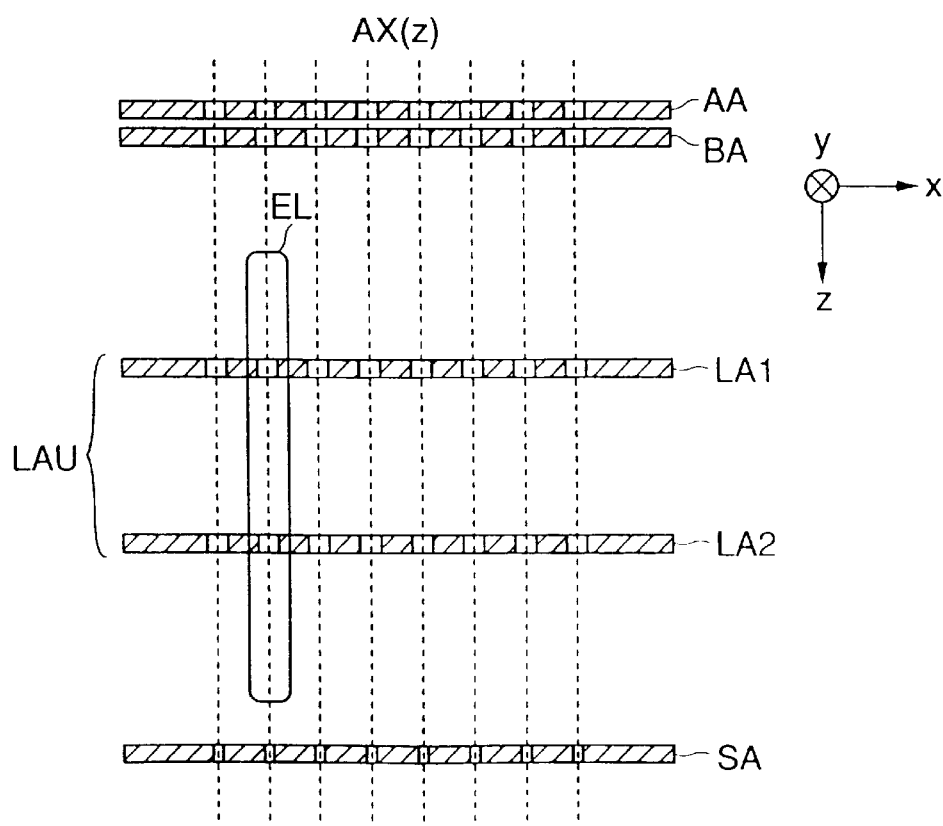

As shown in FIG. 2B, the correction electrooptic system 3 comprises an aperture array AA, blanker array BA, element electrooptic system array unit LAU, and stopper array SA sequentially arranged along an optical axis AX from the electron gun 1. Details of the correction electrooptic system 3 will be described later. The correction electrooptic system 3 forms a plurality of intermediate images of the electron source ES. Each intermediate image is reduced and projected by a projection electrooptic system 4, and the image of the electron source ES is formed on a wafer 5 as a surface to be exposed.

The projection electrooptic system 4 is constituted by a symmetrical magnetic doublet made up of a first projection lens 41 (43) and second projection lens 42 (44). Letting fi be the focal length of the first projection lens 41 (43), and f2 be the focal length of the second projection lens 42 (44), the distance between the two lenses is f1+f2. The object point on the optical axis AX is at the focal position of the first projection lens 41 (43), and the image point is at the focal point of the second projection lens 42 (44). This image is reduced to −f2/f1. Since the magnetic fields of the two lenses are determined to act in opposite directions, Seidel aberrations and chromatic aberrations concerning rotation and magnification are theoretically canceled except for five aberrations, i.e., spherical aberration, isotropic astigmatism, isotropic coma, curvature of field, and on-axis chromatic aberration.

Reference numeral 6 denotes a deflector for deflecting a plurality of electron beams from the element electrooptic system array of the correction electrooptic system 3 and displacing a plurality of light source images on the wafer 5 by almost the same displacement amount in the X and Y directions. Although not shown, the deflector 6 is comprised of a main deflector used when the scan width is large, and a sub-deflector used when the scan width is small. The main deflector is an electromagnetic deflector, whereas the sub-deflector is an electrostatic deflector.

Reference numeral 7 denotes a dynamic focus coil for correcting a shift in the focal position of a light source image caused by deflection aberration generated when the deflector 6 operates; 8, a dynamic stigmatic coil for correcting astigmatism among deflection aberrations generated by deflection; 9, a θ-Z stage which supports the wafer 5, is movable in the optical axis AX (Z-axis) direction and the rotational direction around the Z-axis, and has a stage reference plate 10 fixed thereto; 11, an X-Y stage which supports the θ-Z stage 9 and is movable in the X and Y directions perpendicular to the optical axis AX (Z-axis); and 12, a reflected-electron detector for detecting reflected electrons generated upon irradiating a mark on the stage reference plate 10 with an electron beam.

<Description of Building Component of Correction Electrooptic System>

The correction electrooptic system 3 used in the electron beam exposure apparatus of the first embodiment will be explained with reference to FIGS. 2A and 2B.

As described above, the correction electrooptic system 3 comprises the aperture array AA, blanker array BA, element electrooptic system array unit LAU, and stopper array SA.

FIG. 2A is a view of the correction electrooptic system 3 when viewed from the electron gun 1, and FIG. 2B is a sectional view taken along the line A–A' in FIG. 2A.

As shown in FIG. 2A, the aperture array AA has a plurality of apertures regularly formed in a substrate, and splits an electron beam from the condenser lens 2 into a plurality of electron beams.

The blanker array BA is constituted by forming on one substrate a plurality of small deflectors for individually deflecting electron beams split by the aperture array AA.

Figure 3:
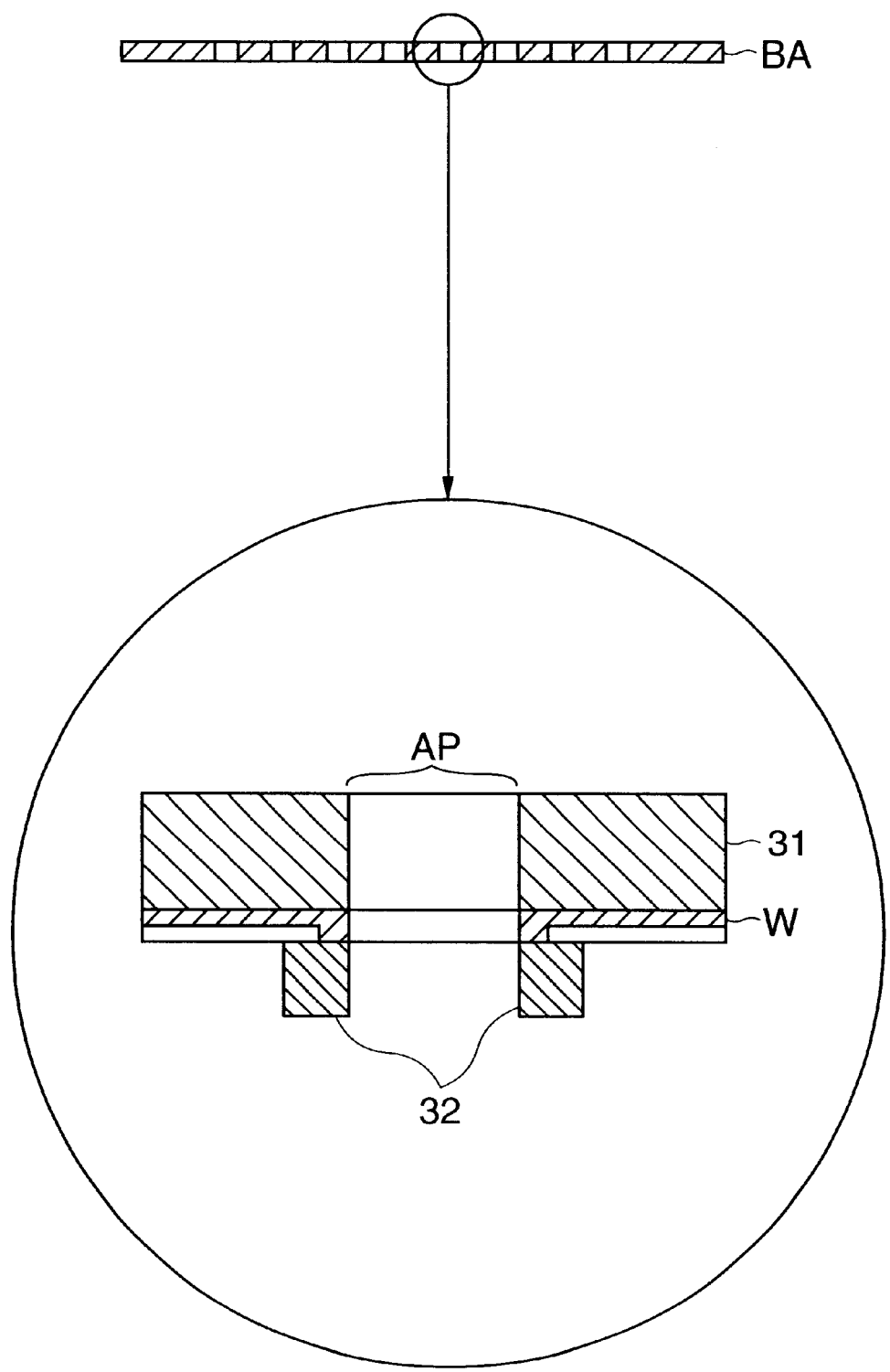
FIG. 3 is a view for explaining one small deflector of a blanker array BA.

FIG. 3 is a view showing one small deflector. A substrate 31 has an aperture AP. A blanking electrode 32 is made up of a pair of electrodes via the aperture AP and has a deflection function. The substrate 31 has a wiring line (W) for individually turning on/off the blanking electrode 32.

The element electrooptic system array unit LAU is formed from first and second electrooptic system arrays LA1 and LA2 prepared by two-dimensionally arraying a plurality of electron lens on the same plane.

Figure 4:
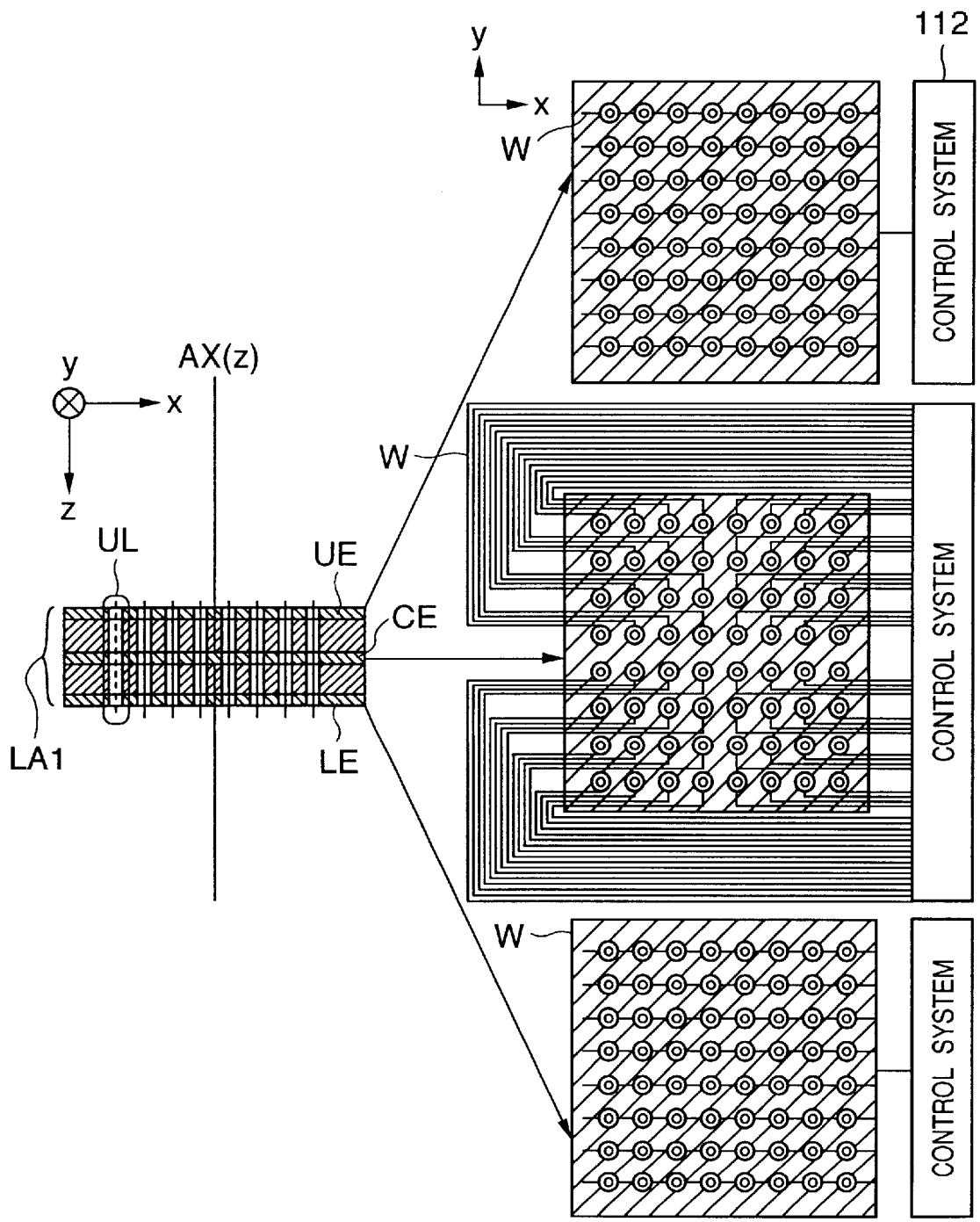
FIG. 4 is a view for explaining a first electrooptic system array LA1.

FIG. 4 is a view for explaining the first electrooptic system array LA1. The first electrooptic system array LA1 has three, upper, middle, and lower electrode plates UE, CE, and LE each having an array of doughnut-like electrodes formed in correspondence with apertures. The three electrode plates are stacked via insulators. Doughnut-like electrodes of the upper, middle, and lower electrode plates aligned along a common Z-axis function as one electron lens UL, so-called unipotential lens. All the doughnut-like electrodes of the upper and lower electrode plates (UE and LE) of the respective electron lenses UL are connected to an LAU control system via common wiring lines (W) and set to the same potential. (In the first-embodiment, the potentials of the upper and lower electrodes are set to an electron beam acceleration potential.)

The doughnut-like electrodes of the middle electrode plate CE of the respective electron lenses UL are connected to the LAU control system via individual wiring lines (W). This wiring enables setting the electrooptic powers (focal lengths) of the electron lenses to desired values. The second electrooptic system array LA2 also has the same structure and function as those of the first electrooptic system array LA1.

Referring back to FIG. 2B, in the element electrooptic system array unit LAU, the electron lenses of the first and second electron lens arrays LA1 and LA2 aligned along a common Z-axis form one element electrooptic system EL. The aperture array AA is positioned on almost the front focal position side of the respective element electrooptic systems EL. The element electrooptic systems EL, therefore, form intermediate images of the electron source ES at almost the rear focal positions by a plurality of split electron beams.

Similar to the aperture array AA, the stopper array SA has a plurality of apertures formed in a substrate. An electron beam deflected by the blanker array BA moves to a portion outside an aperture of the stopper array SA corresponding to the electron beam, and does not pass the stopper array SA.

A plurality of intermediate images formed by the above-described correction electrooptic system 3 generate aberration when being projected on the wafer via the projection electrooptic system 4.

<Description of Aberration Correction Method>

Figure 5:
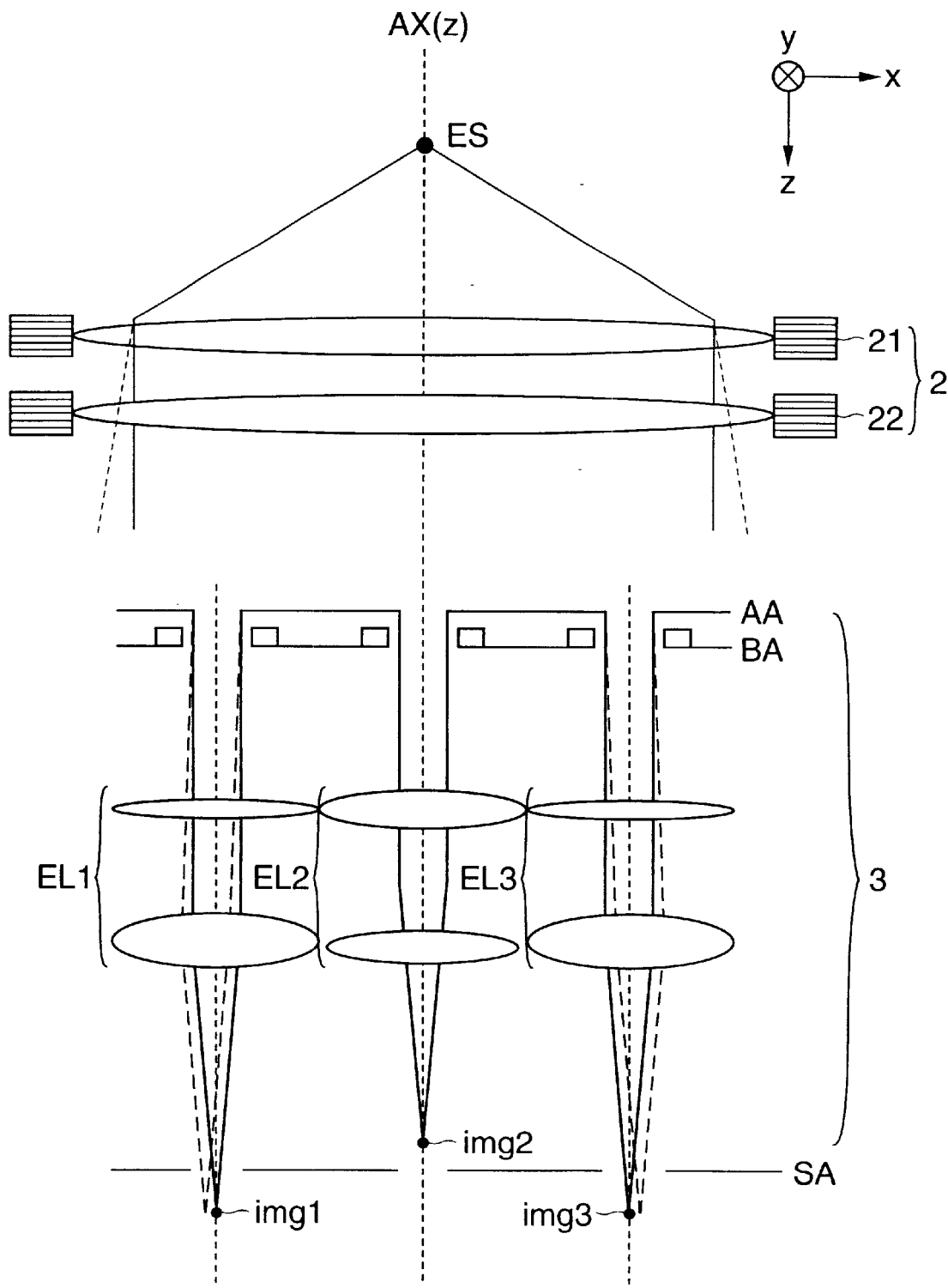
FIG. 5 is a view for explaining an aberration correction method according to the first embodiment.

A method of correcting the curvature of field and distortion in the electron beam exposure apparatus of the first embodiment will be explained with reference to FIG. 5. In FIG. 5, the same reference numerals as in FIGS. 1, 2A, and 2B denote the same parts, and a description thereof will be omitted.

<Description of Correction Method for Curvature of Field>

Correction of the curvature of field (deviation between an actual imaging position of an intermediate image and an ideal imaging position on the wafer 5 along the optical axis AX (Z) of the projection electrooptic system 4) will be described.

Element electrooptic systems EL1 to EL3 form intermediate images img1 to img3 by electron beams split by the aperture array AA. In correcting the curvature of field, positions of the intermediate images img1 to img3 along the optical axis AX (Z) are adjusted to positions where the curvature of field generated in the projection electrooptic system 4 is canceled. More specifically, the electrooptic powers (focal lengths) of electron lenses constituting each element electrooptic system are individually adjusted. While synthesized electrooptic powers are set equal between the element electrooptic systems, the principal plane positions of the element electrooptic systems are made different depending on the curvature of field. Thus, the curvature of field generated in the projection electrooptic system can be corrected, and intermediate images can be projected on the wafer with the same size.

<Description of Correction Method for Distortion>

Correction of distortion (deviation between an actual imaging position of an intermediate image and an ideal imaging position on the wafer 5 in directions perpendicular to the optical axis of the projection electrooptic system 4) will be described.

In correction of distortion, when the intermediate images img1 to img3 are to be formed, positions of the intermediate images img1 to img3 in directions (X and Y) perpendicular to the optical axis AX (Z) are adjusted to positions where distortion generated in the projection electrooptic system 4 is canceled. More specifically, the electrooptic powers (focal lengths) of the electron lenses 21 and 22 constituting the condenser lens 2 are individually adjusted to change the positional relationship between the front focal position of the condenser lens 2 and the electron source ES. As a result, the orbit of an electron beam incident on the aperture array AA is changed for divergence, convergence, and collimation.

If the electron source ES is located at the front focal position of the condenser lens 2, an almost collimated electron beam enters the aperture array AA, as represented by electron beams of solid lines in FIG. 5. Then, the intermediate images img1 to img3 are formed on the optical axes of the corresponding element electrooptic systems EL1 to EL3. To the contrary, if the electrooptic powers of the electron lenses 21 and 22 are individually adjusted to locate the electron source ES on the condenser lens 2 side from the front focal position of the condenser lens 2, an electron beam diverges and enters the aperture array AA, as represented by electron beams of broken lines in FIG. 5. Then, the intermediate images img1 to img3 are formed at positions apart from the optical axis AX (Z) of the condenser lens 2 in comparison with the electron beams of the solid lines. If the electron source ES is located closer to the electron gun 1 than the front focal position of the condenser lens 2, an electron beam converges. Hence, the intermediate images img1 to img3 are formed at positions near the optical axis AX (Z) of the condenser lens 2 in comparison with the electron beams of the solid lines.

Figure 6A:
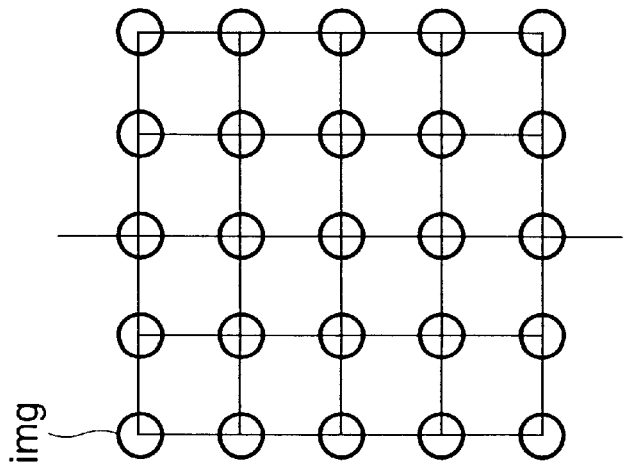
FIGS. 6A to 6C are views for explaining the position adjustment of an intermediate image.
Figure 6B:
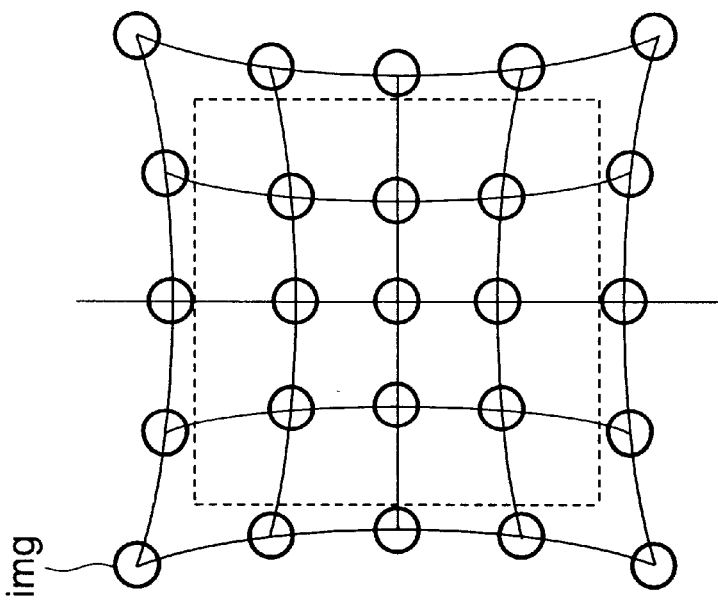
Figure 6C:
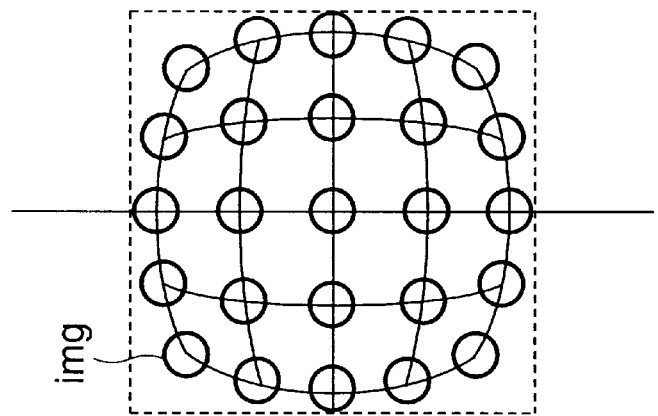

More specifically, assume that a plurality of intermediate images are formed as shown in FIG. 6A when the electron source ES is located at the front focal position of the condenser lens 2 and an almost collimated electron beam enters the aperture array AA. In this case, a plurality of intermediate images are formed as shown in FIG. 6B when the focal lengths of the electron lenses 21 and 22 are individually adjusted to locate the electron source ES closer to the condenser lens than the front focal position of the condenser lens 2. A plurality of intermediate images are formed as shown in FIG. 6C when the front focal position of the condenser lens 2 is located closer to the condenser lens than the electron source ES. By individually adjusting the electrooptic powers of the electron lenses 21 and 22, a plurality of intermediate images can be formed at positions where generated distortion is canceled.

In individually adjusting the electrooptic powers of the electron lenses 21 and 22, the sizes of intermediate images are kept unchanged by keeping constant the electrooptic power (electrooptic power synthesized by the electron lenses 21 and 22) of the condenser lens 2. Distortion generated in the projection electrooptic system 4 can be corrected, and intermediate images can be projected on the wafer with the same size.

In the first embodiment, the condenser lens 2 is made up of two electron lenses. When the condenser lens 2 is made up of three or more electron lenses, distortion generated in the projection electrooptic system can be corrected by individually adjusting the electrooptic powers of at least two electron lenses.

Further, various distortions can be corrected by adding a quadrupole lens having different electrooptic powers on X-Z and Y-Z sections to the condenser lens 2. Distortion asymmetrical about the optical axis AX can also be corrected by individually adjusting the positional relationship between the front focal position and the electron source ES for each section of the condenser lens 2 including the optical axis AX.

<Description of System Configuration>

FIG. 7 is a block diagram showing a system configuration according to the first embodiment. A CL control circuit 110 controls the focal lengths of the electron lenses constituting the condenser lens 2. A BA control circuit 111 individually controls ON/OFF operations of the blanking electrodes of the blanker array BA. An LAU control circuit 112 controls the focal lengths of the electron lenses constituting the lens array unit LAU.

A D_STIG control circuit 113 controls the dynamic stigmatic coil 8 to correct astigmatism of the projection electrooptic system 4. A D_FOCUS control circuit 114 controls the dynamic focus coil 7 to control the focus of the projection electrooptic system 4. A deflection control circuit 115 controls the deflector 6. An optical characteristic control circuit 116 adjusts the optical characteristics (magnification and distortion) of the projection electrooptic system 4. A reflected-electron detection circuit 117 calculates a reflected electron amount on the basis of a signal from the reflected-electron detector 12.

A stage driving control circuit 118 drives and controls the θ-Z stage 9, and drives and controls the X-Y stage 11 in cooperation with a laser interferometer LIM for detecting the position of the X-Y stage 11.

A control system 120 controls these control circuits based on data from a memory 121 which stores a drawing pattern. The control system 120 is controlled by a CPU 123 which controls the overall electron beam exposure apparatus via an interface 122.

<Description of Distortion Correction Operation>

Distortion correction operation in the electron beam exposure apparatus of the first embodiment will be described.

Figure 8:
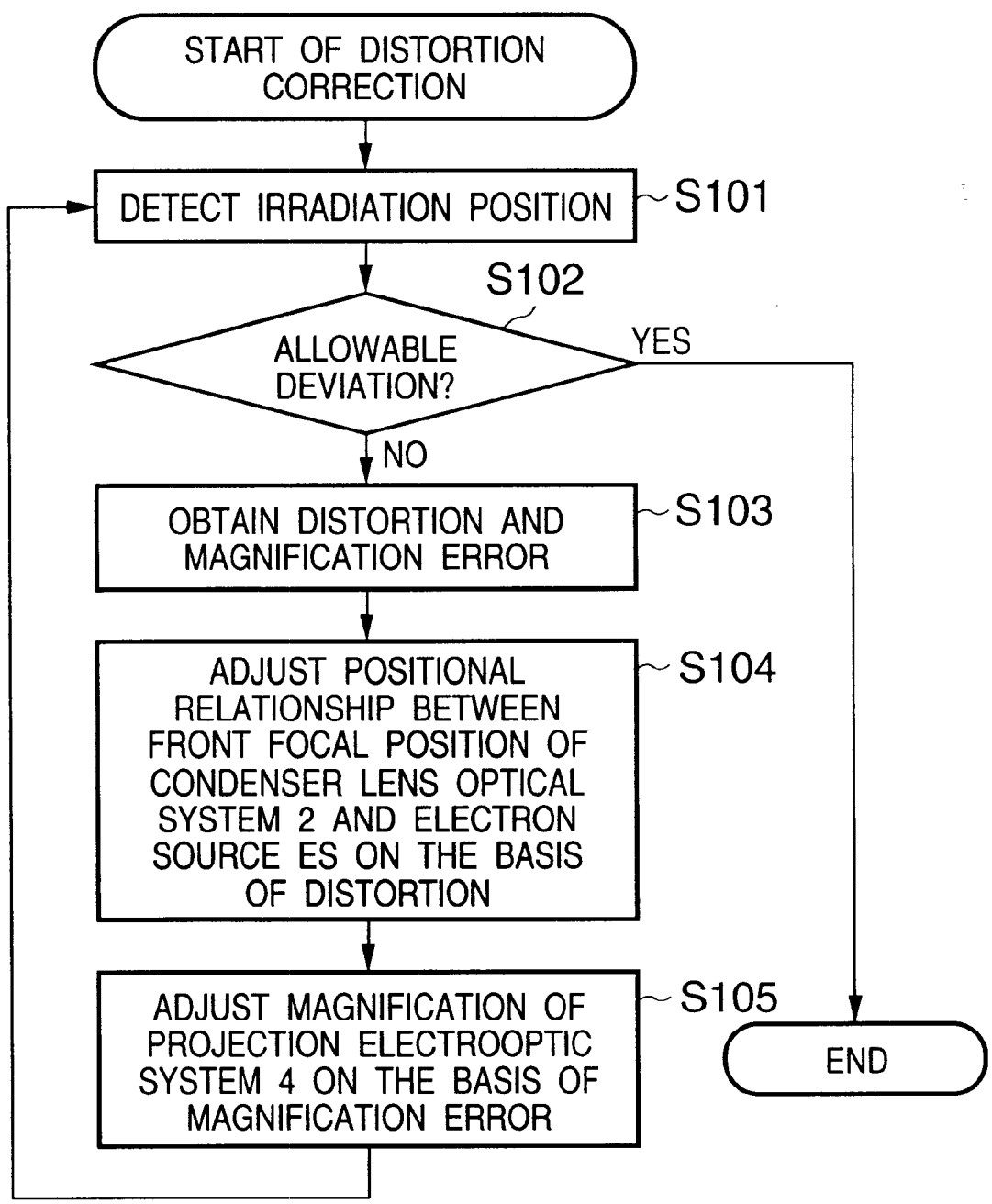
FIG. 8 is a flow chart for explaining distortion correction operation according to the first embodiment.

The CPU 123 instructs the control system 120 to execute distortion correction processing as shown in FIG. 8 at a predetermined time interval. For example, the distortion correction may be performed, prior to exposure processings, at every wafer, at every lot of wafers (for example, one lot has 25 wafers) or every morning.

Processing shown in FIG. 8 will be explained in an order of steps.

(Step S101) The control system 120 instructs the BA control circuit 111 to irradiate the wafer with only a selected electron beam in order to detect the irradiation position of each electron beam on the wafer (position where an intermediate image is projected on the wafer via the projection electrooptic system). At this time, the stage driving control circuit positions the reference mark of the reference plate 10 to an ideal irradiation position (design irradiation position) of the selected electron beam. The deflection control circuit 115 scans the reference mark with the selected electron beam, and reflected-electron information from the reference mark is obtained from the reflected-electron detection circuit 117. From this information, the control system 120 detects the current irradiation position of the electron beam. This operation is executed for all electron beams.

(Step S102) The control system 120 calculates the deviation between the actual irradiation position and the ideal irradiation position for each electron beam, and determines whether the deviation is a predetermined allowable value or less. If the deviation is the allowable value or less for all the electron beams (YES in S102), the control system 120 ends correction of distortion; and if NO, shifts to S103.

(Step S103) The control system 120 obtains the current distortion and magnification error of the projection electrooptic system 4 on the basis of the calculated deviation of each electron beam. "Magnification error" means the deviation error between an actual magnification and a design magnification.

(Step S104) The control system 120 instructs the CL control circuit 110 to adjust the positional relationship between the front focal position of the condenser lens 2 and the electron source ES so as to correct the obtained distortion.

(Step S105) The control system 120 instructs the optical characteristic control circuit 116 to adjust the magnification of the projection electrooptic system 4 so as to correct the obtained magnification error. Then, the control system 120 returns to S101.

<Description of Exposure Operation>

Exposure operation of the electron beam exposure apparatus according to the first embodiment will be explained with reference to FIGS. 7 and 9.

Prior to the following exposure operation, distortion is corrected by the sequence described with reference to FIG. 8. After distortion is corrected, the control system 120 shifts to the following exposure processing.

On the basis of exposure control data from the memory 121, the control system 120 instructs the deflection control circuit 115 to deflect a plurality of electron beams by the deflector 6, and instructs the BA control circuit 111 to individually turn on/off the blanking electrodes of the blander array BA in accordance with a pattern to be projected on the wafer 5. At this time, the X-Y stage 11 continuously moves in the Y direction. The deflector 6 deflects a plurality of electron beams so as to follow movement of the X-Y stage. Respective electron beams scan and expose corresponding element exposure fields (EF) on the wafer 5, as shown in FIG. 9. The element exposure fields (EF) for respective electron beams are two-dimensionally adjacent to each other. Hence, a subfield (SF) made up of a plurality of element exposure fields (EF) exposed simultaneously is exposed.

After one subfield (SF1) is exposed, the control system 120 instructs the deflection control circuit 115 to deflect a plurality of electron beams by the deflector 6 in a direction (X direction) perpendicular to the stage scan direction (Y direction) in order to expose the next subfield (SF2). At this time, aberration upon reducing and projecting each electron beam via the projection electrooptic system 4 also changes with switching of the subfield by deflection. Therefore, the control system 120 instructs the LAU control circuit 112, D_STIG control circuit 113, and D_FOCUS control circuit 114 to adjust the lens array unit LAU, dynamic stigmatic coil 8, and dynamic focus coil 7 so as to correct the changed aberration.

Subfield 2 (SF2) is exposed by exposing corresponding element exposure fields (EF) again with respective electron beams, as described above. As shown in FIG. 9, subfields (SF1 to SF6) are sequentially exposed to expose the wafer 5 to the pattern. Resultantly, a main field (MF) formed from a plurality of subfields (SF1 to SF6) aligned in the direction (X direction) perpendicular to the stage scan direction (Y direction) is formed on the wafer 5.

Figure 9:
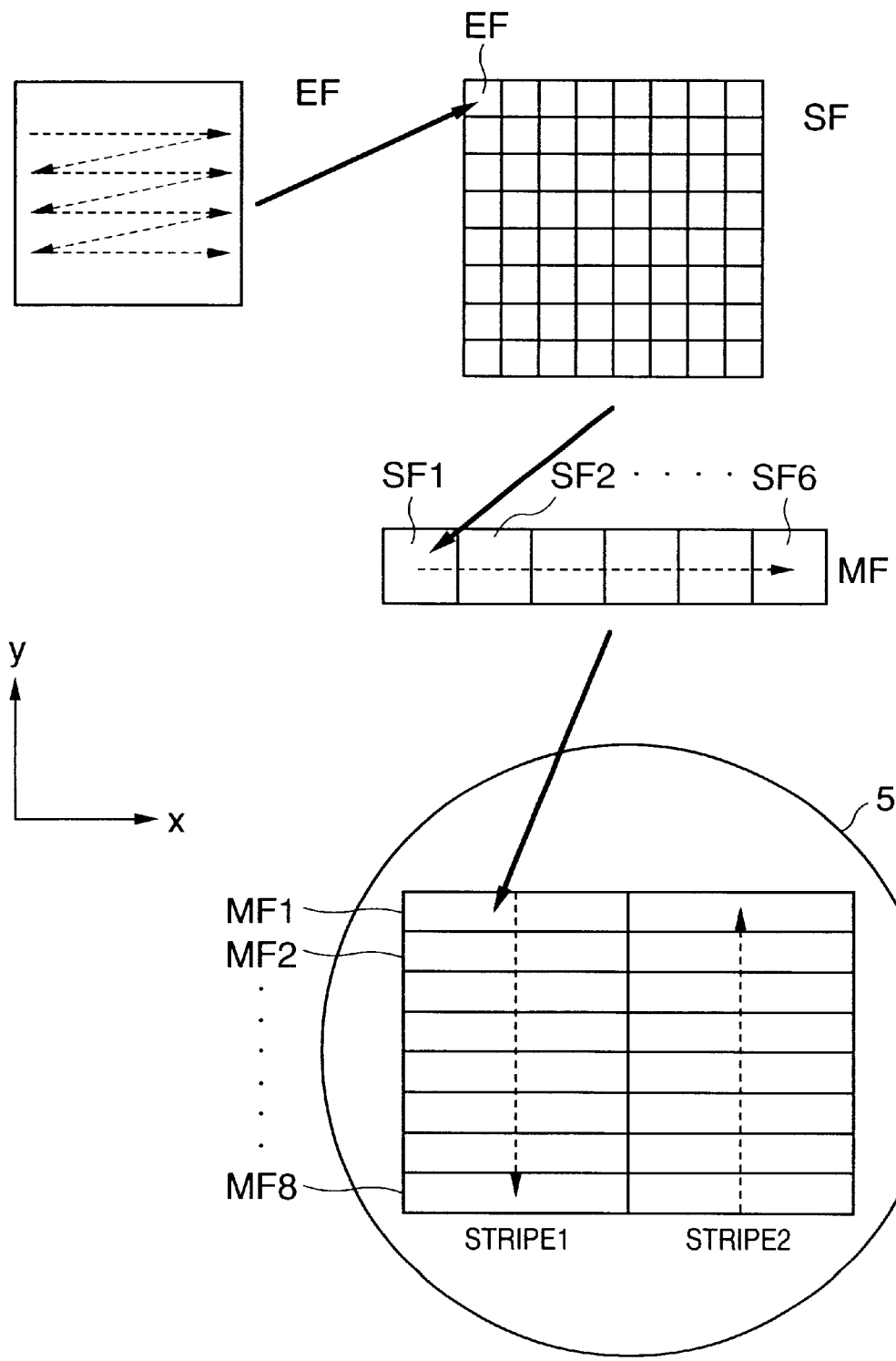
FIG. 9 is a view for explaining exposure operation of the electron beam exposure apparatus according to the first embodiment.

After exposure of main field 1 (MF1) shown in FIG. 9, the control system 120 instructs the deflection control circuit 115 to sequentially deflect a plurality of electron beams to main fields (MF2, MF3, MF4, . . . ) aligned in the stage scan direction (Y direction) and expose the wafer 5. As shown in FIG. 9, a stripe (STRIPE1) formed from the main fields (MF1, MF2, MF3, MF4, . . . ) is formed. The X-Y stage 11 is moved by one step in the X direction, and the wafer 5 is exposed to the next stripe (STRIPE2).

As described above, the first embodiment corrects distortion by adjusting the electrooptic power of the condenser lens 2, and can easily implement appropriate correction without using any complicated mechanism.

Second Embodiment

The first embodiment corrects distortion by changing the front focal position of the condenser lens 2. The second embodiment corrects distortion by another method.

<Building Component of Electron Beam Exposure Apparatus>

Figure 10:
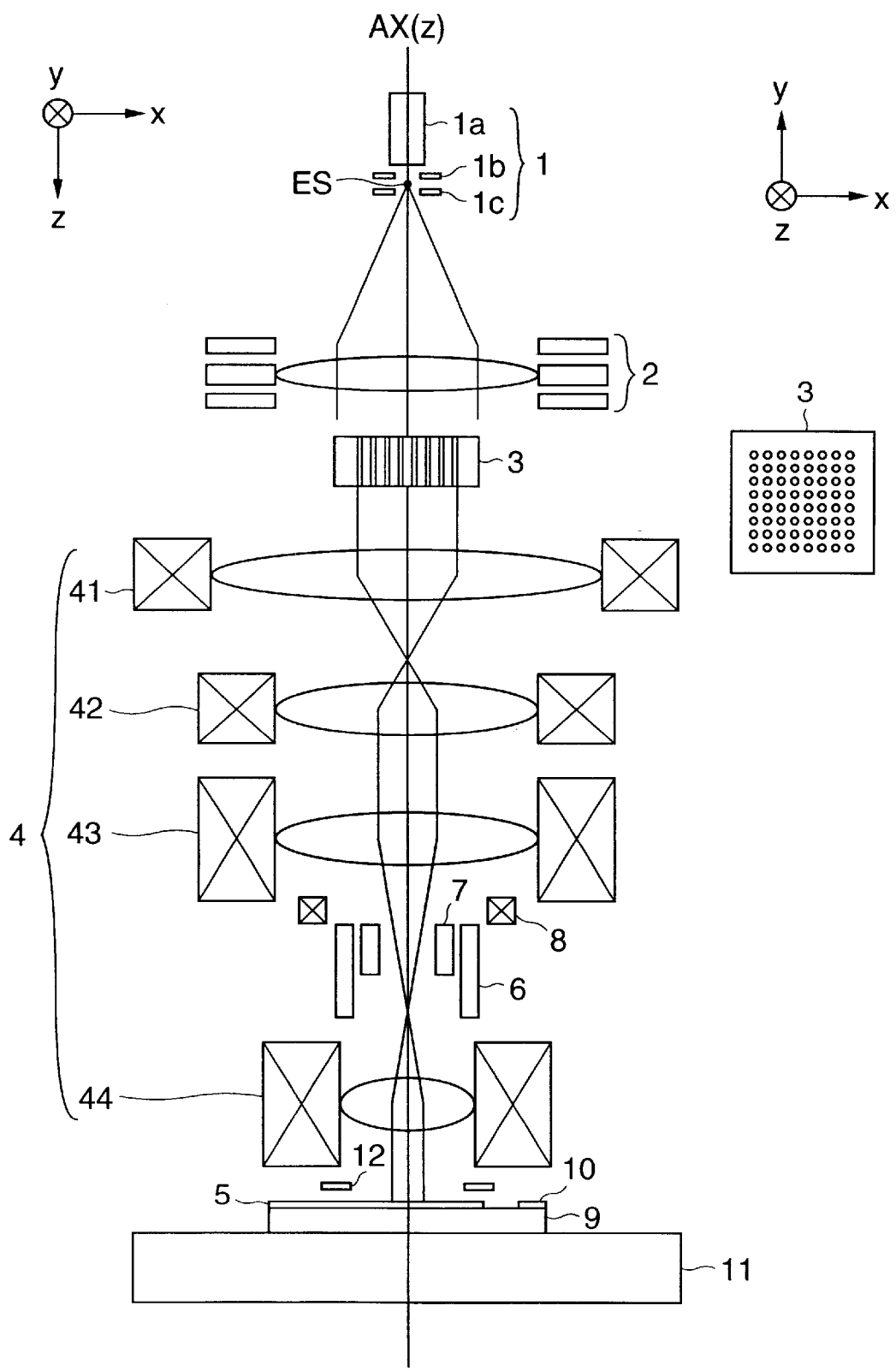
FIG. 10 is a schematic view showing the main part of an electron beam exposure apparatus according to the second embodiment.

FIG. 10 is a schematic view showing the main part of an electron beam exposure apparatus according to the second embodiment of the present invention.

In FIG. 10, the same reference numerals as in the electron beam exposure apparatus of the first embodiment shown in FIG. 1 denote the same parts, and a description thereof will be omitted.

In the second embodiment, a condenser lens 2 is formed from one electron lens having three aperture electrodes. The condenser lens 2 does not include the unipotential lenses 21 and 22 as a feature of the first embodiment, but may include the unipotential lenses 21 and 22 in the first embodiment. However, the unipotential lenses 21 and 22 need not be arranged for correction of distortion because the second embodiment does not correct distortion by adjusting the front focal position of the condenser lens 2.

<Description of Building Component of Correction Electrooptic System>

A correction electrooptic system 3 used in the electron beam exposure apparatus of the second embodiment will be explained with reference to FIGS. 11A and 11B.

Figure 11A:
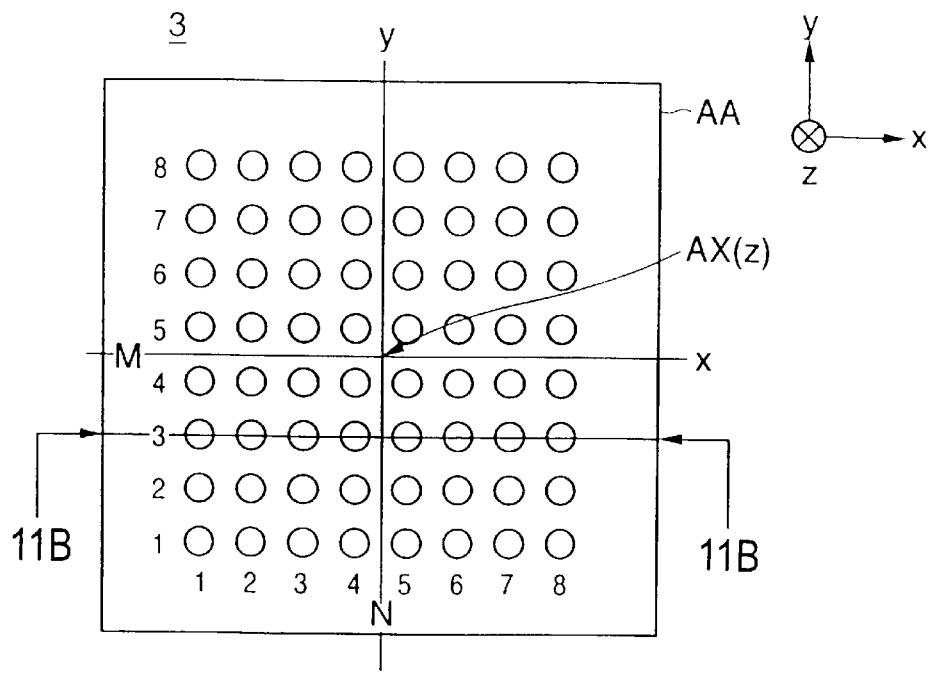
FIGS. 11A and 11B are views for explaining a correction electrooptic system according to the second embodiment.
Figure 11B:
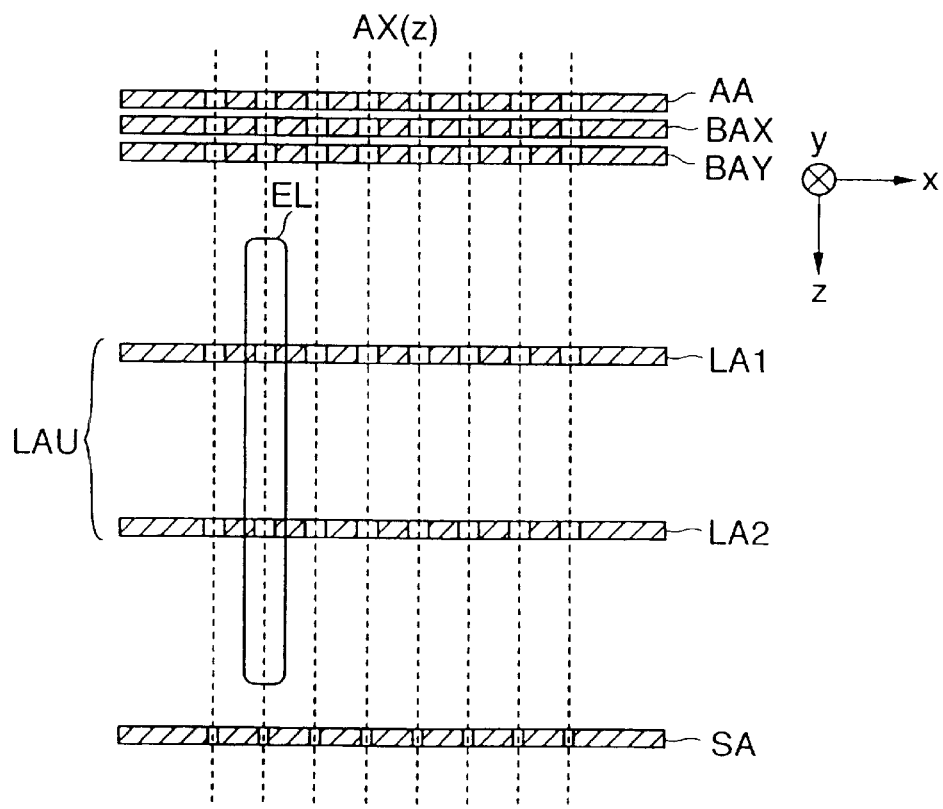

In FIGS. 11A and 11B, the same reference numerals as in the correction electrooptic system 3 of the first embodiment shown in FIGS. 2A and 2B denote the same parts, and a description thereof will be omitted.

The correction electrooptic system 3 of the second embodiment comprises an aperture array AA, X blanker array BAX, Y blanker array BAY, element electrooptic system array unit LAU, and stopper array SA.

FIG. 11A is a view of the correction electrooptic system 3 when viewed from an electron gun 1, and FIG. 11B is a sectional view taken along the line A–A' in FIG. 11A.

The arrangement and function of the aperture array AA are the same as in the first embodiment (FIG. 2A), and a description thereof will be omitted. The front focal position of element electrooptic systems EL, however, is positioned at the middle between the small deflectors of X and Y branker arrays.

The blanker array of the second embodiment is made up of the X and Y blanker arrays BAX and BAY.

Each of the X and Y blanker arrays BAX and BAY is constituted by forming on one substrate an array of small deflectors for individually deflecting electron beams split by the aperture array AA. Details of each small deflector have been described with reference to FIG. 3. That is, a substrate 31 has an aperture AP. Each aperture AP has a blanking electrode 32 which is made up of a pair of electrodes via the aperture and has a deflection function. The substrate 31 has wiring lines (W) for individually turning on/off the blanking electrodes 32.

As shown in FIG. 12A, all the blanking electrodes 32 of the X blanker array BAX face the X direction and deflect electron beams from the aperture array AA in the X direction. As shown in FIG. 12B, all the blanking electrodes 32 of the Y blanker array BAY face the Y direction and deflect electron beams from the aperture array AA in the Y direction.

The arrangement and function of the element electrooptic system array unit LAU are the same as in the first embodiment (FIG. 4), and a description thereof will be omitted.

In FIG. 11B, the stopper array SA has a plurality of apertures formed in a substrate, similar to the aperture array AA. An electron beam given a deflection amount in order to shield it by using at least one of the X and Y blanker arrays BAX and BAY moves to a portion outside an aperture of the stopper array SA corresponding to the electron beam, and does not pass the stopper array SA. That is, such an electron beam is shielded by the stopper array SA and does not enter a wafer 5.

<Description of Aberration Correction Method>

Figure 13:
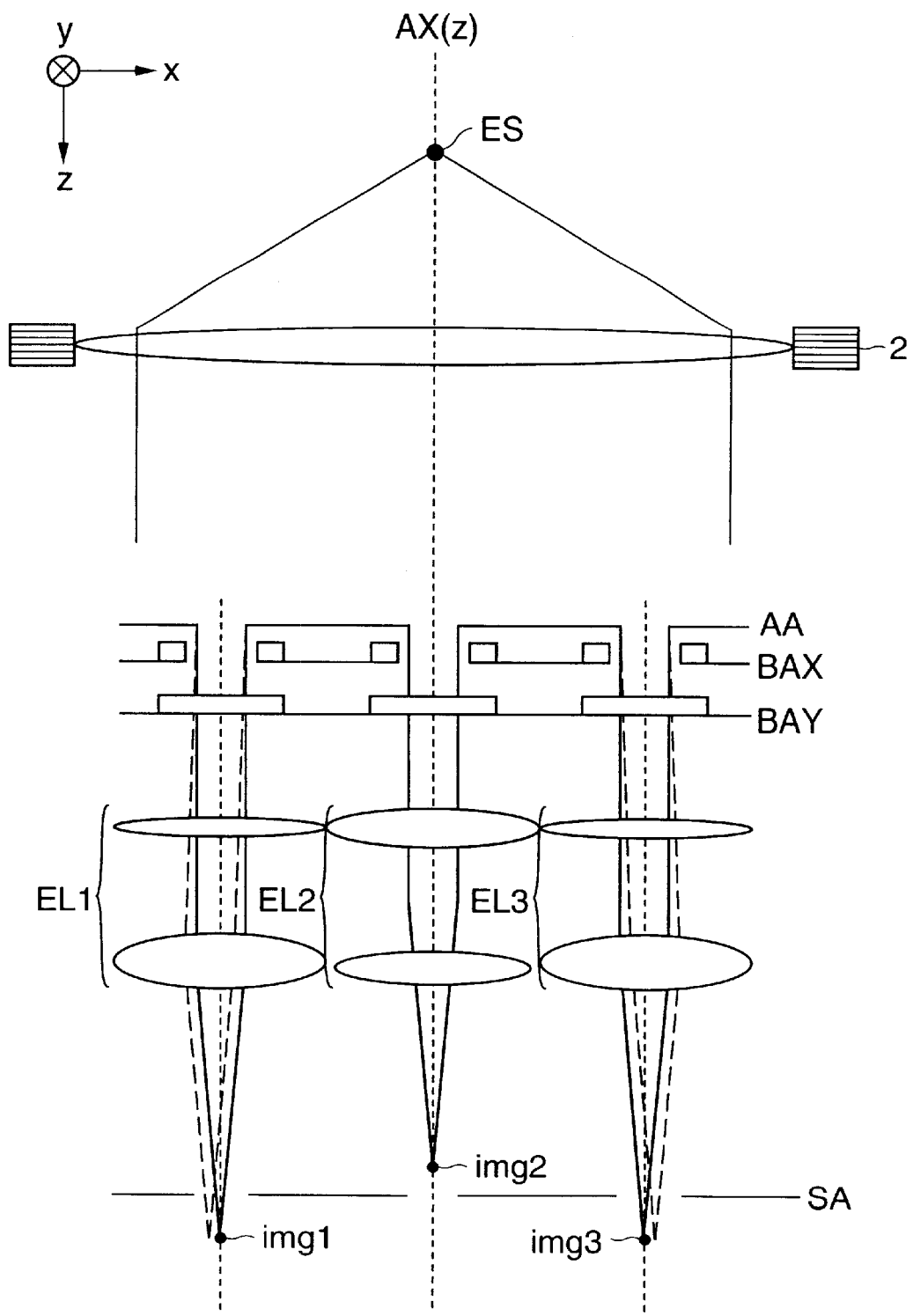
FIG. 13 is a view for explaining a method of curvature of field and distortion in the electron beam apparatus of the second embodiment.

A method of correcting the curvature of field and distortion in the electron beam exposure apparatus of the second embodiment will be explained with reference to FIG. 13. In FIG. 13, the same reference numerals as in FIGS. 10, 11A, and 11B denote the same parts, and a description thereof will be omitted.

Also, the same reference numerals as in the arrangement of the first embodiment described with reference to FIG. 5 denote the same parts in FIG. 13, and a description thereof will be omitted.

<Correction Method for Curvature of Field>

The correction method for the curvature of field in the second embodiment is the same as in the first embodiment, and a description thereof will be omitted.

<Description of Correction Method for Distortion>

Correction of distortion (deviation between an actual imaging position of an intermediate image and an ideal imaging position on the wafer 5 in directions perpendicular to the optical axis of a projection electrooptic system 4) according to the second embodiment will be described.

In correction of distortion, when intermediate images img1 to img3 are to be formed, positions of the intermediate images img1 to img3 in directions (X and Y) perpendicular to the optical axis AX (Z) are adjusted to positions where distortion generated in the projection electrooptic system 4 is canceled. More specifically, distortion is corrected by individually adjusting deflection amounts given to electron beams by the X and Y blanker arrays BAX and BAY.

Figure 14:
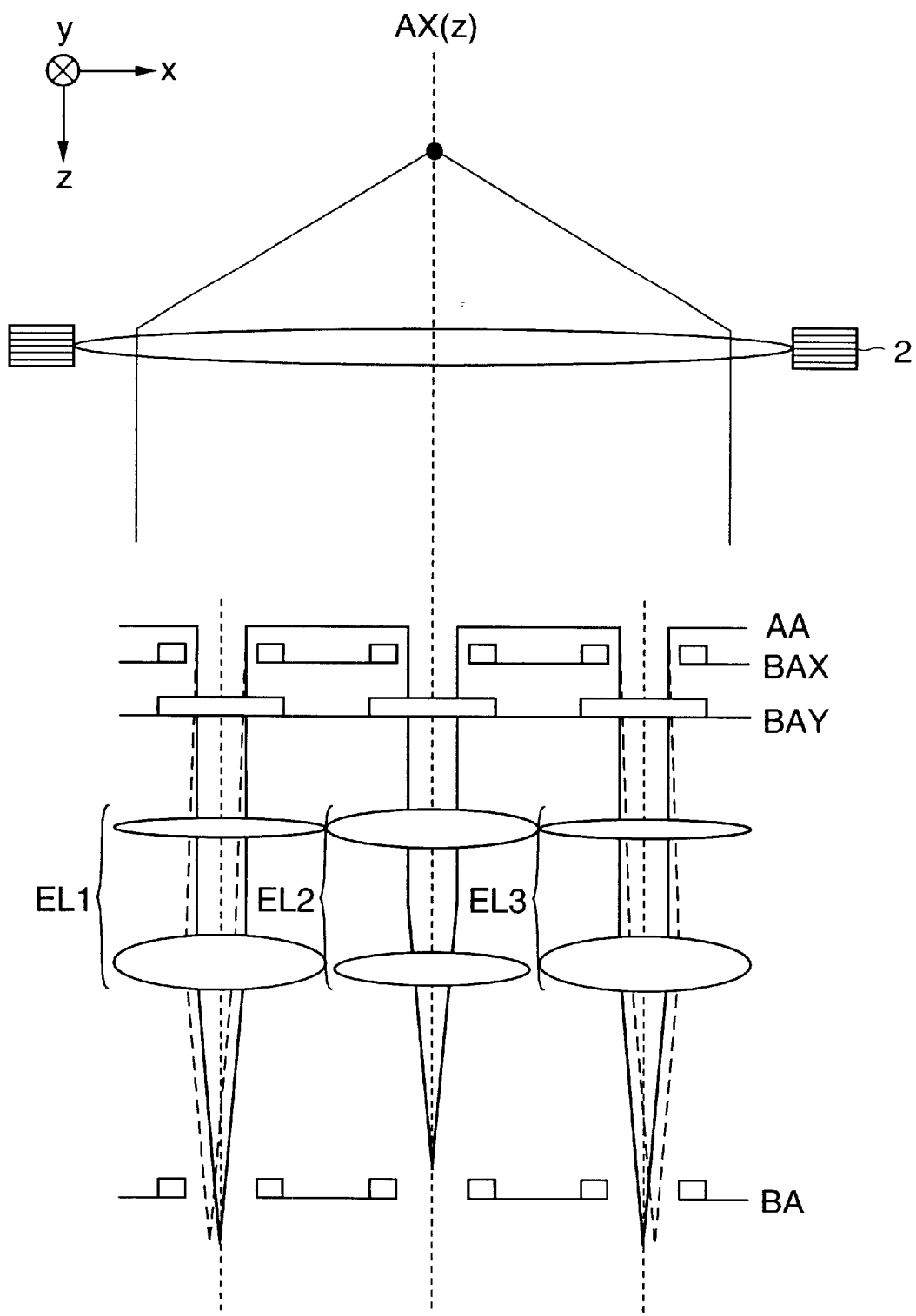
FIG. 14 is a view for explaining a modification of the second embodiment that adopts a blanker array for shielding an electron beam.

If the X and Y blanker arrays BAX and BAY do not deflect electron beams, the intermediate images img1 to img3 are formed on the optical axes of corresponding element electrooptic systems EL1 to EL3, as represented by electron beams of solid lines in FIG. 14. On the contrary, if the X blanker array BAX deflects electron beams so as to move them apart from the optical axis AX in accordance with the positions of the electron beams from the optical axis AX, the intermediate images img1 to img3 move along the X-axis, as represented by electron beams of broken lines in FIG. 14, and are formed at positions apart from the optical axis AX (Z) of the condenser lens 2 in comparison with the electron beams of the solid lines. If the Y blanker array BAY is used, the intermediate images img1 to img3 move along the Y-axis. If both the X and Y blanker arrays BAX and BAY are used, the intermediate images can be moved in an arbitrary direction on the X-Y plane.

More specifically, assume that a plurality of intermediate images are formed as shown in FIG. 6A when the X and Y blanker arrays BAX and BAY do not deflect electron beams. In this case, a plurality of intermediate images are formed as shown in FIG. 6B when the X and Y blanker arrays BAX and BAY deflect electron beams so as to move them apart from the optical axis AX in accordance with the positions of the electron beams from the optical axis AX. A plurality of intermediate images are formed as shown in FIG. 6C when the X and Y blanker arrays BAX and BAY deflect electron beams so as to move close to the optical axis AX in accordance with the positions of the electron beams from the optical axis AX. By individually adjusting deflection amounts given to electron beams by the X and Y blanker arrays BAX and BAY, a plurality of intermediate images can be formed at positions where generated distortion is canceled.

In this manner, according to the second embodiment, the X and Y blanker arrays BAX and BAY individually give predetermined deflection amounts to electron beams in order to correct distortion. To shield a specific intermediate image so as not to project it on the wafer surface, a shielding deflection amount is given to a blanking electrode of at least one of the X and Y blanker arrays BAX and BAY that corresponds to the specific intermediate image. Note that the intermediate image may be shielded by arranging a shielding blanker array BA as shown in FIG. 14 and using different blanker arrays for correction of distortion and shielding. The shielding blanker array BA is arranged at the position of the stopper array SA in the second embodiment. In this case, a stopper for an electron beam deflected by the shielding blanker array BA must be arranged at the pupil position of the projection electrooptic system 4. Because the projection electrooptic system 4 comprises two tablets, there are two pupil positions. Preferably, the above mentioned stopper is arranged at the pupil position of the electron source side (between the first projection lens 41 and the second projection lens 42, more specifically, a position located at almost the rear focal position of the first projection lense).

<Description of System Configuration>

Figure 15:
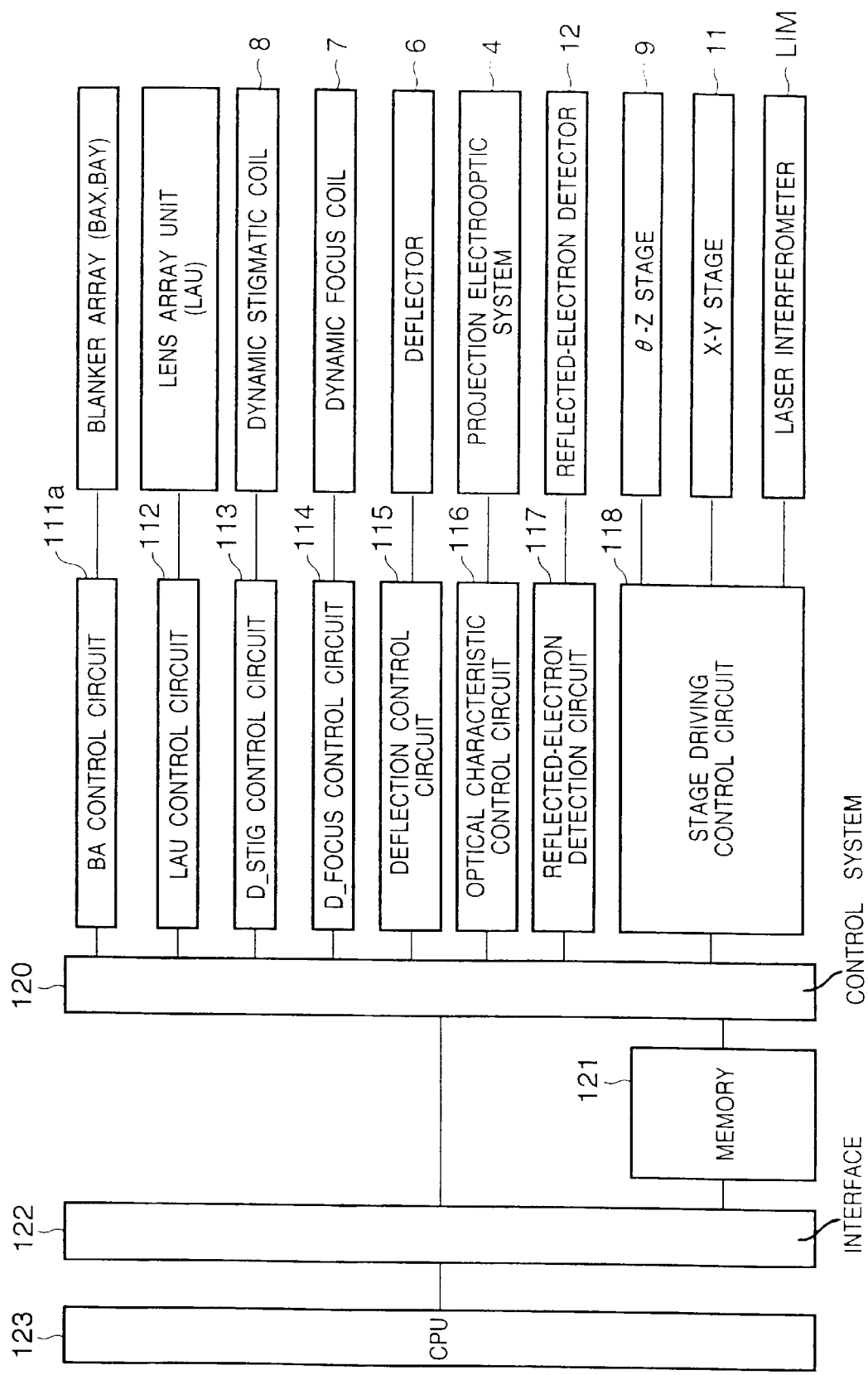
FIG. 15 is a block diagram for explaining the system configuration of the electron beam exposure apparatus according to the second embodiment.

FIG. 15 shows a system configuration according to the second embodiment.

In FIG. 15, the same reference numerals as in the system configuration of the first embodiment shown in FIG. 7 denote the same parts, and a description thereof will be omitted.

A BA control circuit 111*a* individually gives predetermined deflection amounts to each electron beam by the X and Y blanker arrays BAX and BAY in order to correct distortion. To shield projection of a specific intermediate image on the wafer surface, the BA control circuit 111*a* adds a predetermined deflection amount and gives a shielding deflection amount to an electron beam by a blanking electrode of at least one of the X and Y blanker arrays BAX and BAY that corresponds to the specific intermediate image.

Compared to the system configuration in FIG. 7 according to the first embodiment, the system configuration in FIG. 15 omits the CL control circuit 110 for controlling the focal length of the condenser lens 2. This is because the second embodiment corrects distortion not by controlling the focal length of the condenser lens 2 but by controlling the deflection amounts of the blanker arrays BAX and BAY, as described above. However, correction of distortion is not limited to the use of only the blanker arrays BAX and BAY. Distortion may be corrected both by the condenser lens 2 in the first embodiment and by the blanker arrays BAX and BAY in the second embodiment. This will be described below as another embodiment.

<Description of Distortion Correction Operation>

Distortion correction operation in the electron beam exposure apparatus of the second embodiment will be described with reference to the flow chart of FIG. 16.

Figure 16:
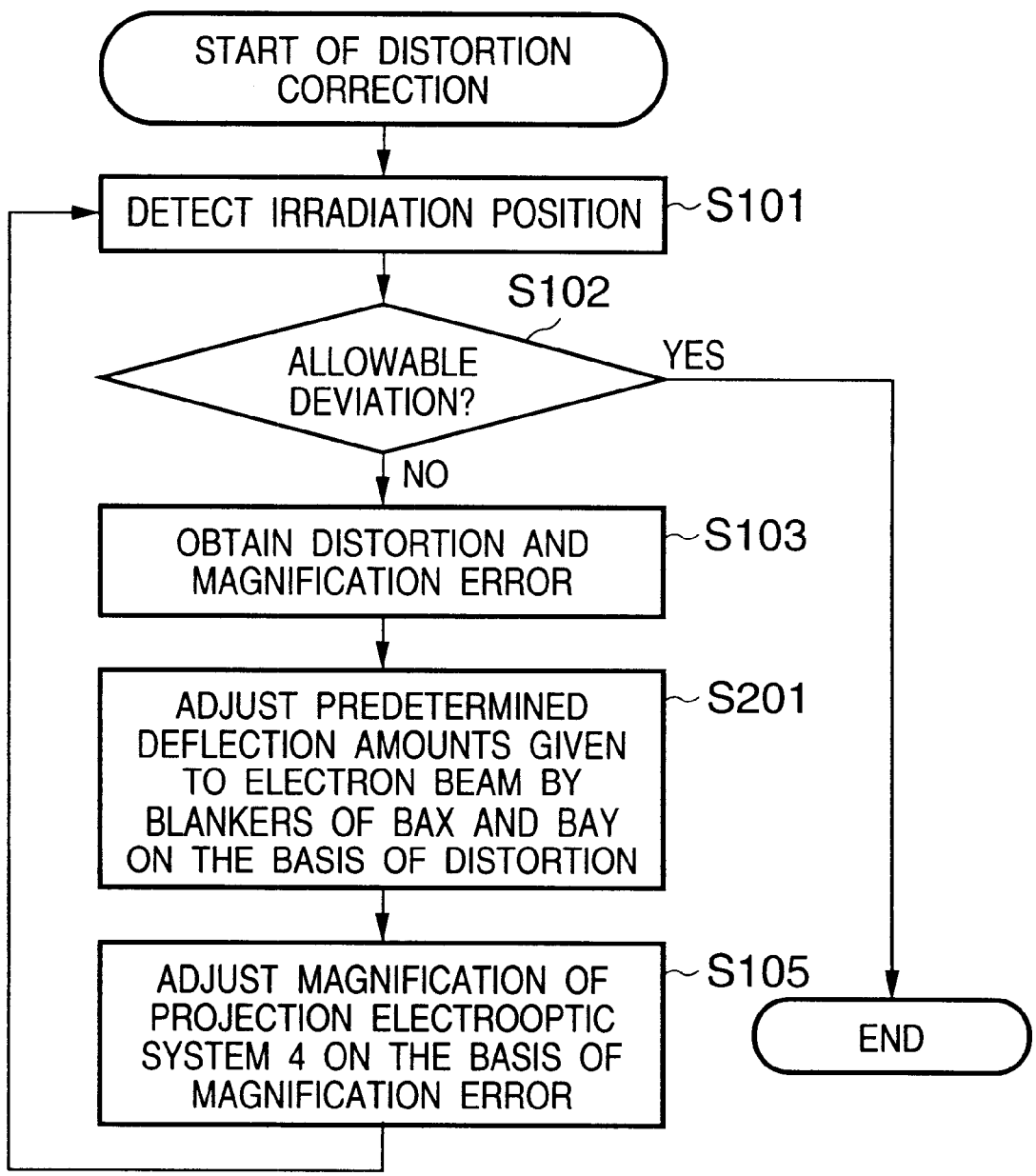
FIG. 16 is a flow chart for explaining distortion correction operation according to the second embodiment.

A CPU 123 instructs a control system 120 to execute distortion correction processing as shown in FIG. 16 at a predetermined time interval.

In FIG. 16, steps S101 to S103 and S105 are the same as in the first embodiment, and a description thereof will be omitted.

In step S201, the control system 120 instructs the BA control circuit 111a to adjust predetermined deflection amounts (correction deflection amounts) given to each electron beam by the X and Y blanker arrays BAX and BAY.

<Description of Exposure Operation>

Exposure operation of the electron beam exposure apparatus according to the second embodiment will be explained with reference to FIG. 17.

On the basis of exposure control data from a memory 121, the control system 120 instructs a deflection control circuit 115 to deflect a plurality of electron beams by a deflector 6, and instructs the BA control circuit 111a to give an electron beam a shielding deflection amount by a blanking electrode of both or one of the X and Y blanker arrays BAX and BAY in accordance with a pattern to be projected on the wafer 5. At this time, an X-Y stage 11 continuously moves in the Y direction. The deflector 6 deflects a plurality of electron beams so as to follow movement of the X-Y stage. Respective electron beams scan and expose corresponding element exposure fields (EF) on the wafer 5, as shown in FIG. 9. The element exposure fields (EF) for respective electron beams are two-dimensionally adjacent to each other. Thus, a subfield (SF) made up of a plurality of element exposure fields (EF) exposed simultaneously is exposed.

An operation of sequentially exposing subfields (SF1 to SF6) by deflection to expose a main field, and an operation of sequentially exposing main fields in the scan direction to a stripe are the same as in the first embodiment, and a description thereof will be omitted.

As described above, the second embodiment can correct distortion for each electron beam by the blanker arrays, and can implement finer correction.

In this embodiment, the deflection amounts of small deflectors can be individually controlled for all charged-particle beams. Alternatively, the deflection amount may be adjusted in units of groups each made up of a plurality of small deflectors by sharing a wiring line between these small deflectors.

Third Embodiment

The third embodiment will be explained. The third embodiment adopts both correction of distortion according to the first embodiment and correction of distortion according to the second embodiment.

In the distortion correction method described in the first embodiment, the electrooptic powers of the electron lenses 21 and 22 are individually adjusted to form a plurality of intermediate images at positions where generated distortion is canceled. This method realizes easy adjustment because of a small number of control targets (adjustment targets), and can correct systematic distortion (distortion of the projection electrooptic system).

In the second embodiment, distortion is corrected by individually adjusting deflection amounts given to an electron beam by the X and Y blanker arrays BAX and BAY. This method uses many adjustment items because of a larger number of control targets (adjustment targets) in comparison with the first embodiment, but can correct both systematic distortion (distortion of the projection electrooptic system) and random distortion.

An electron beam exposure apparatus according to the third embodiment has the arrangement shown in FIG. 1 except for the arrangement of a correction electrooptic system 3 shown in FIGS. 11A, 11B, 12A, and 12B.

Figure 17:
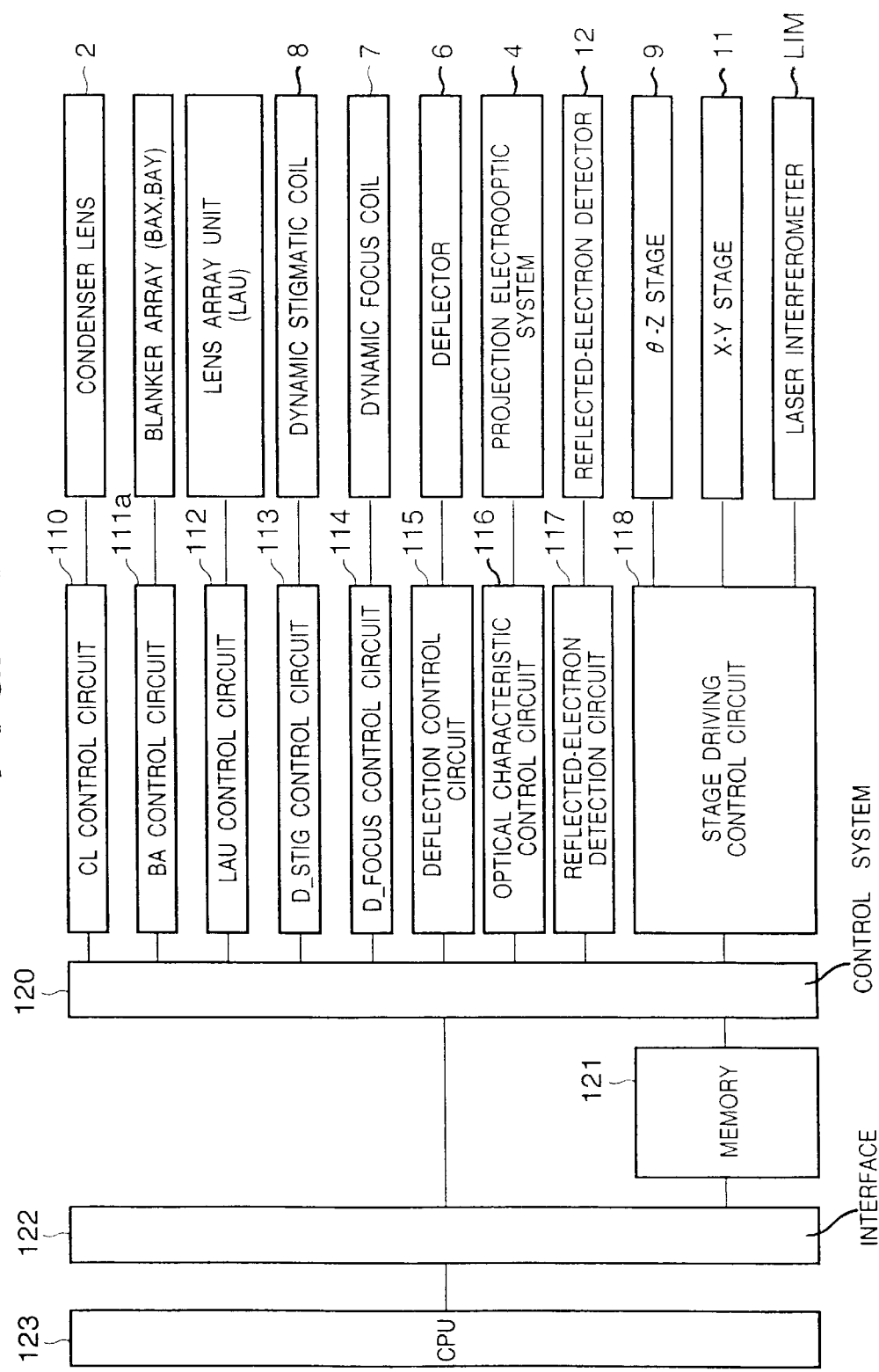
FIG. 17 is a block diagram for explaining the system configuration of an electron beam exposure apparatus according to the third embodiment.

FIG. 17 shows a control system according to the third embodiment. A CL control circuit 110 controls the focal lengths of electron lenses constituting an irradiation electrooptic system 2. A BA control circuit 111a didually gives predetermined deflection amounts to each electron beam by X and Y blanker arrays BAX and BAY in order to correct distortion. To shield projection of a specific intermediate image on the wafer surface, the BA control circuit 111a adds a predetermined deflection amount and gives a shielding deflection amount to an electron beam by a blanking electrode of at least one of the X and Y blanker arrays BAX and BAY that corresponds to the specific intermediate image. The exposure control system of the third embodiment corrects distortion by using the CL control circuit 110 and BA control circuit 111a.

<Description of Distortion Correction Operation>

Figure 18:
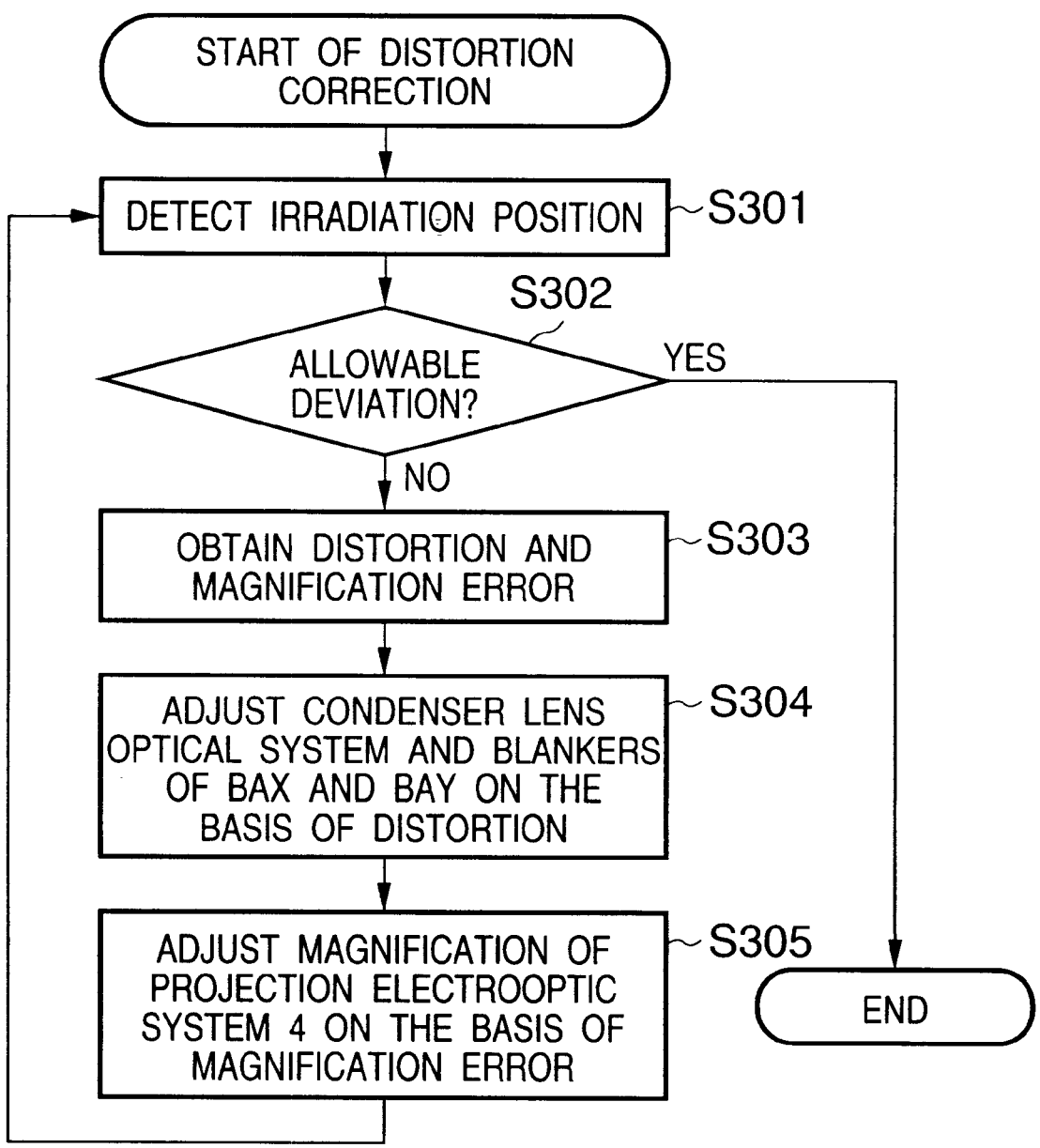
FIG. 18 is a flow chart for explaining distortion correction operation according to the third embodiment.

Distortion correction operation in the electron beam exposure apparatus of the third embodiment will be described. A CPU 123 instructs a control system 120 to execute distortion correction processing as shown in the flow chart of FIG. 18 at a predetermined time interval.

Steps will be explained. Note that processes in steps S301 to S303 and S305 are the same as those in steps S101 to S103 and S105 shown in FIG. 8, but will be repetitively described.

(Step S301) The control system 120 instructs the BA control circuit 111a to irradiate a wafer with only a selected electron beam in order to detect the irradiation position of each electron beam on the wafer (position where an intermediate image is projected on the wafer via the projection electrooptic system) At this time, a stage driving control circuit 118 positions the reference mark of a reference plate 10 to an ideal irradiation position (design irradiation position) of the selected electron beam. A deflection control circuit 115 scans the reference mark with the selected electron beam, and reflected-electron information from the reference mark is obtained from a reflected-electron detection circuit 117. From this information, the control system 120 detects the current irradiation position of the electron beam. This operation is executed for all electron beams.

(Step S302) The control system 120 calculates the deviation between the actual irradiation position and the ideal irradiation position for each electron beam, and determines whether the deviation is a predetermined allowable value or less. If the deviation is the allowable value or less for all the electron beams (Y in S302), the control system 120 ends correction of distortion; and if N, advances to S303.

(Step S303) The control system 120 obtains the current distortion and magnification error of a projection electrooptic system 4 on the basis of the calculated deviation of each electron beam. "Magnification error" means the deviation between an actual magnification and a design magnification.

(Step S304) The control system 120 calculates an adjustment target value so as to correct the obtained distortion, and instructs the CL control circuit 110 to change the positional relationship between the front focal position of the irradiation electrooptic system 2 and an electron source ES. However, the irradiation electrooptic system 2 can correct only systematic distortion, as described above. Thus, the control system 120 instructs the BA control circuit 111a to adjust predetermined deflection amounts given to each electron beam by the X and Y blanker arrays BAX and BAY on the basis of the difference between the adjustment target value and the adjustment amount of the irradiation electrooptic system 2.

(Step S305) The control system 120 instructs an optical characteristic control circuit 116 to adjust the magnification of the projection electrooptic system 4 so as to correct the obtained magnification error. Then, the control system 120 returns to S301.

As described above, the third embodiment corrects distortion by both the condenser lens and blanker arrays, and can implement higher-precision correction.

Modification of Third Embodiment

Figure 19:
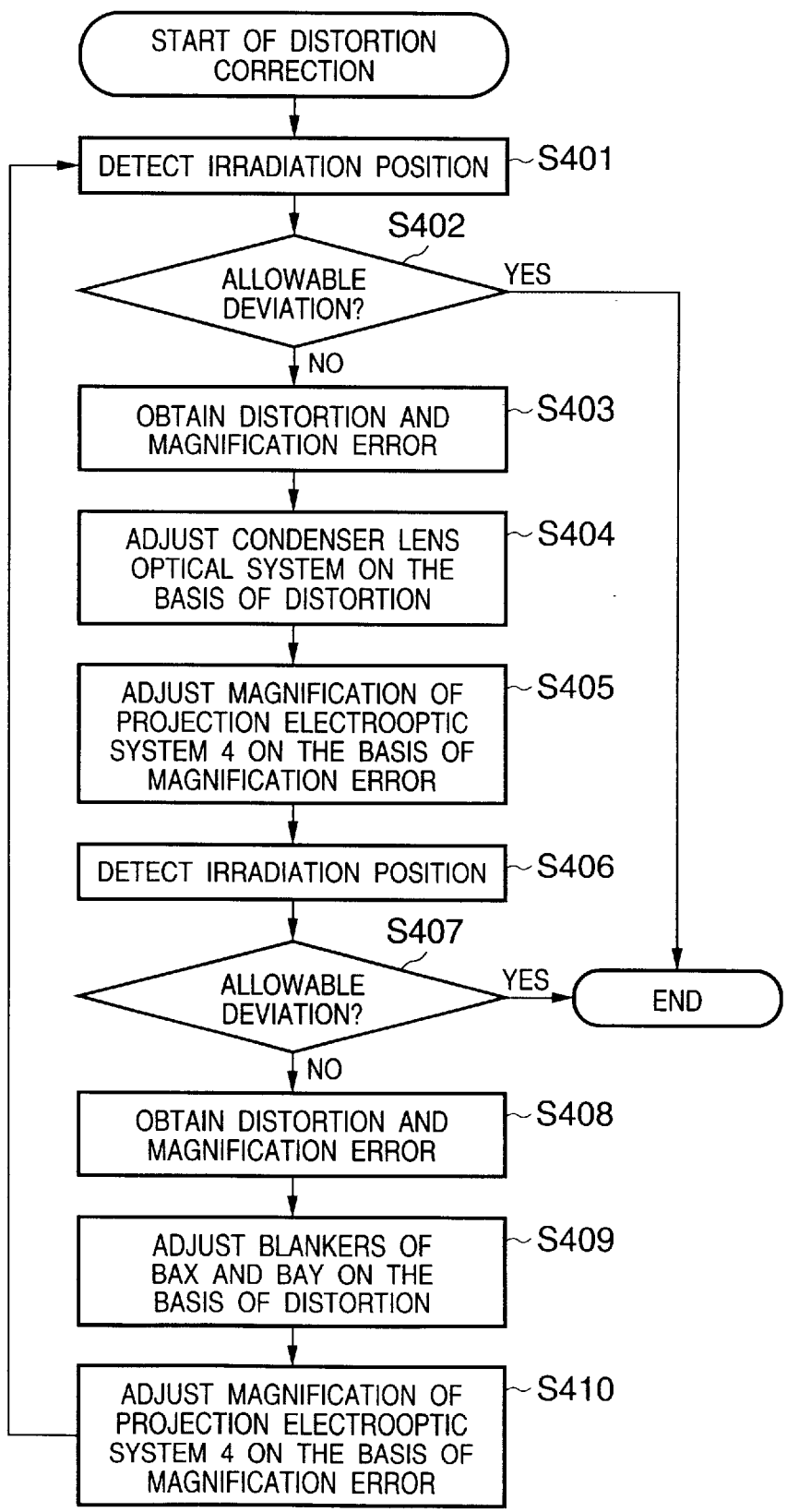
FIG. 19 is a flow chart for explaining distortion correction operation according to a modification of the third embodiment.

FIG. 19 is a flowchart showing distortion correction processing as a modification of the third embodiment. In this modification, generated distortion is corrected by individually adjusting the electrooptic powers of electron lenses 21 and 22. If this correction cannot make distortion fall within an allowable range, distortion is corrected by individually adjusting deflection amounts given to an electron beam by the X and Y blanker arrays BAX and BAY.

Steps will be described.

(Step S401) The control system 120 instructs the BA control circuit 111a to irradiate a wafer with only a selected electron beam in order to detect the irradiation position of each electron beam on the wafer (position where an intermediate image is projected on the wafer via the projection electrooptic system). In this case, the stage driving control circuit positions the reference mark of the reference plate 10 to an ideal irradiation position (design irradiation position) of the selected electron beam. The deflection control circuit 115 scans the reference mark with the selected electron beam, and reflected-electron information from the reference mark is obtained from the reflected-electron detection circuit 117. From this information, the control system 120 detects the current irradiation position of the electron beam. This operation is executed for all electron beams.

(Step S402) The control system 120 calculates the deviation between the actual irradiation position and the ideal irradiation position for each electron beam, and determines whether the deviation is a predetermined allowable value or less. If the deviation is the allowable value or less for all the electron beams, the control system 120 ends correction of distortion; and if N, advances to S403.

(Step S403) The control system 120 obtains the current distortion and magnification error of the projection electrooptic system 4 on the basis of the calculated deviation of each electron beam. "Magnification error" means the deviation between an actual magnification and a design magnification.

(Step S404) The control system 120 calculates an adjustment target value so as to correct the obtained distortion, and instructs the CL control circuit 110 to change the positional relationship between the front focal position of the irradiation electrooptic system 2 and an electron source ES.

(Step S405) The control system 120 instructs the optical characteristic control circuit 116 to adjust the magnification of the projection electrooptic system 4 so as to correct the obtained magnification error.

(Step S406) The control system 120 instructs the BA control circuit 111a to irradiate the wafer with only a selected electron beam in order to detect the irradiation position of each electron beam on the wafer (position where an intermediate image is projected on the wafer via the projection electrooptic system). Similar to step S401, the stage driving control circuit positions the reference mark of the reference plate 10 to an ideal irradiation position (design irradiation position) of the selected electron beam. The deflection control circuit 115 scans the reference mark with the selected electron beam, and reflected-electron information from the reference mark is obtained from the reflected-electron detection circuit 117. From this information, the control system 120 detects the current irradiation position of the electron beam. This operation is executed for all electron beams.

(Step S407) The control system 120 calculates the deviation between the actual irradiation position and the ideal irradiation position for each electron beam, and determines whether the deviation is a predetermined allowable value or less. If the deviation is the allowable value or less for all the electron beams (Y in S407), the control system 120 ends correction of distortion; and if N, advances to S403.

(Step S408) The control system 120 obtains the current distortion and magnification error of the projection electrooptic system 4 on the basis of the calculated deviation of each electron beam. "Magnification error" means the deviation between an actual magnification and a design magnification.

(Step S409) The control system 120 calculates an adjustment target value so as to correct the obtained distortion, and instructs the BA control circuit 111a to adjust predetermined deflection amounts given to each electron beam by the X and Y blanker arrays BAX and BAY.

(Step S410) The control system 120 instructs the optical characteristic control circuit 116 to adjust the magnification of the projection electrooptic system 4 so as to correct the obtained magnification error. After that, the control system 120 returns to S401.

According to this modification, distortion is corrected by the condenser lens, and if necessary, by the blanker arrays. This modification can shorten the correction time while maintaining high-precision correction.

The condenser lens 2 is made up of two electron lenses in the third embodiment but may be made up of three or more electron lenses. In this case, distortion generated in the projection electrooptic system 4 can be corrected by individually adjusting the electrooptic powers of at least three electron lenses.

As described in the first embodiment, various distortions can be corrected by adding a quadrupole lens having different electrooptic powers on X-Z and Y-Z sections to the condenser lens 2.

As described in the second embodiment, different blanker arrays as shown in FIG. 14 may be used for correction of distortion and shielding.

Fourth Embodiment

<Example of Semiconductor Production System>

The fourth embodiment will exemplify an example of a production system for a semiconductor device (semiconductor chip such as an IC or LSI, liquid crystal panel, CCD, thin-film magnetic head, micromachine, or the like) by using the exposure apparatus described in each of the embodiments. A trouble remedy or periodic maintenance of a manufacturing apparatus installed in a semiconductor manufacturing factory, or maintenance service such as software distribution is performed by using a computer network outside the manufacturing factory.

Figure 20:
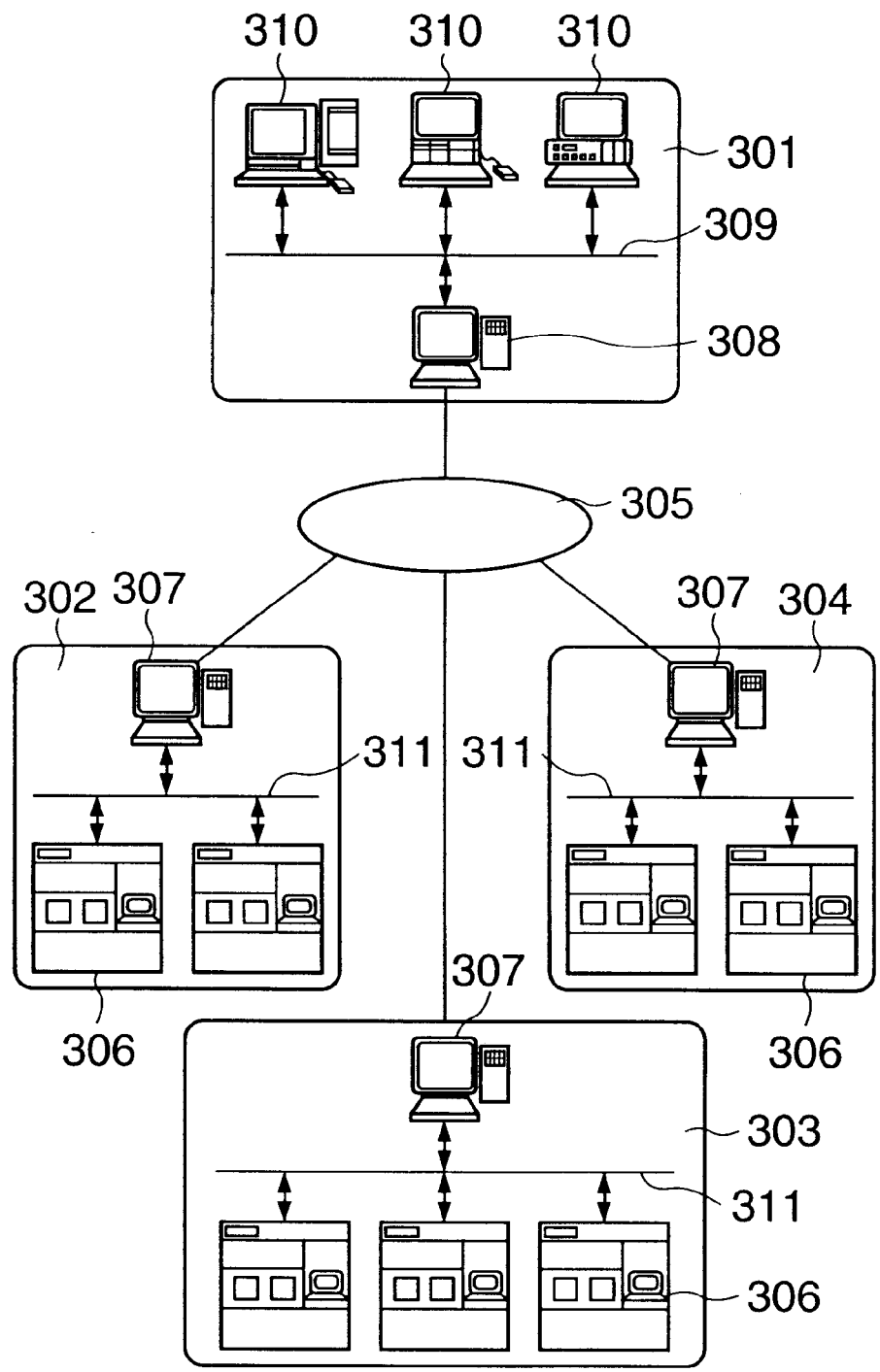
FIG. 20 is a block diagram showing the concept of a semiconductor device production system.

FIG. 20 shows the overall semiconductor device system according to the fourth embodiment which is cut out at a given angle. In FIG. 20, reference numeral 301 denotes a business office of a vendor (apparatus supply manufacturer) which provides a semiconductor device manufacturing apparatus. Assumed examples of the manufacturing apparatus are semiconductor manufacturing apparatuses for various processes used in a semiconductor manufacturing factory, such as pre-process apparatuses (lithography apparatus including an exposure apparatus, resist processing apparatus, and etching apparatus, annealing apparatus, film formation apparatus, planarization apparatus, and the like) and post-process apparatuses (assembly apparatus, inspection apparatus, and the like). The business office 301 comprises a host management system 308 for providing a maintenance database for the manufacturing apparatus, a plurality of operation terminal computers 310, and a LAN (Local Area Network) 309 which connects the computers 310 to construct an intranet. The host management system 308 has a gateway for connecting the LAN 309 to Internet 305 as an external network of the business office, and a security function for limiting external accesses.

Reference numerals 302 to 304 denote manufacturing factories of the semiconductor manufacturer as users of manufacturing apparatuses. The manufacturing factories 302 to 304 may belong to different manufacturers or the same manufacturer (pre-process factory, post-process factory, and the like). Each of the factories 302 to 304 is equipped with a plurality of manufacturing apparatuses 306, a LAN (Local Area Network) 311 which connects these apparatuses 306 to construct an intranet, and a host management system 307 serving as a monitoring apparatus for monitoring the operation status of each manufacturing apparatus 306. The host management system 307 in each of the factories 302 to 304 has a gateway for connecting the LAN 311 in the factory to the Internet 305 as an external network of the factory. Each factory can access the host management system 308 of the business office 301 from the LAN 311 via the Internet 305, and the security function of the host management system 308 authorizes access of only a limited user.

More specifically, the factory notifies the vender via the Internet 305 of status information (e.g., the symptom of a manufacturing apparatus in trouble) representing the operation status of each manufacturing apparatus 306 including the charged-particle beam exposure apparatus described in each of the first to third embodiments. In addition, the factory can receive, from the vender via the Internet 305, response information (e.g., information designating a remedy method against the trouble) for the notification, or maintenance information such as the latest software or help information.

Data communication between the factories 302 to 304 and the vender 301 and data communication via the LAN 311 in each factory use a communication protocol (TCP/IP) generally used in the Internet. Instead of using the Internet as an external network of the factory, a dedicated-line network (e.g., ISDN) having high security which inhibits access of a third party can be adopted. It is also possible that the user constructs a database in addition to one provided by the vendor and sets the database on an external network and that the host management system authorizes access to the database from a plurality of user factors.

Figure 21:
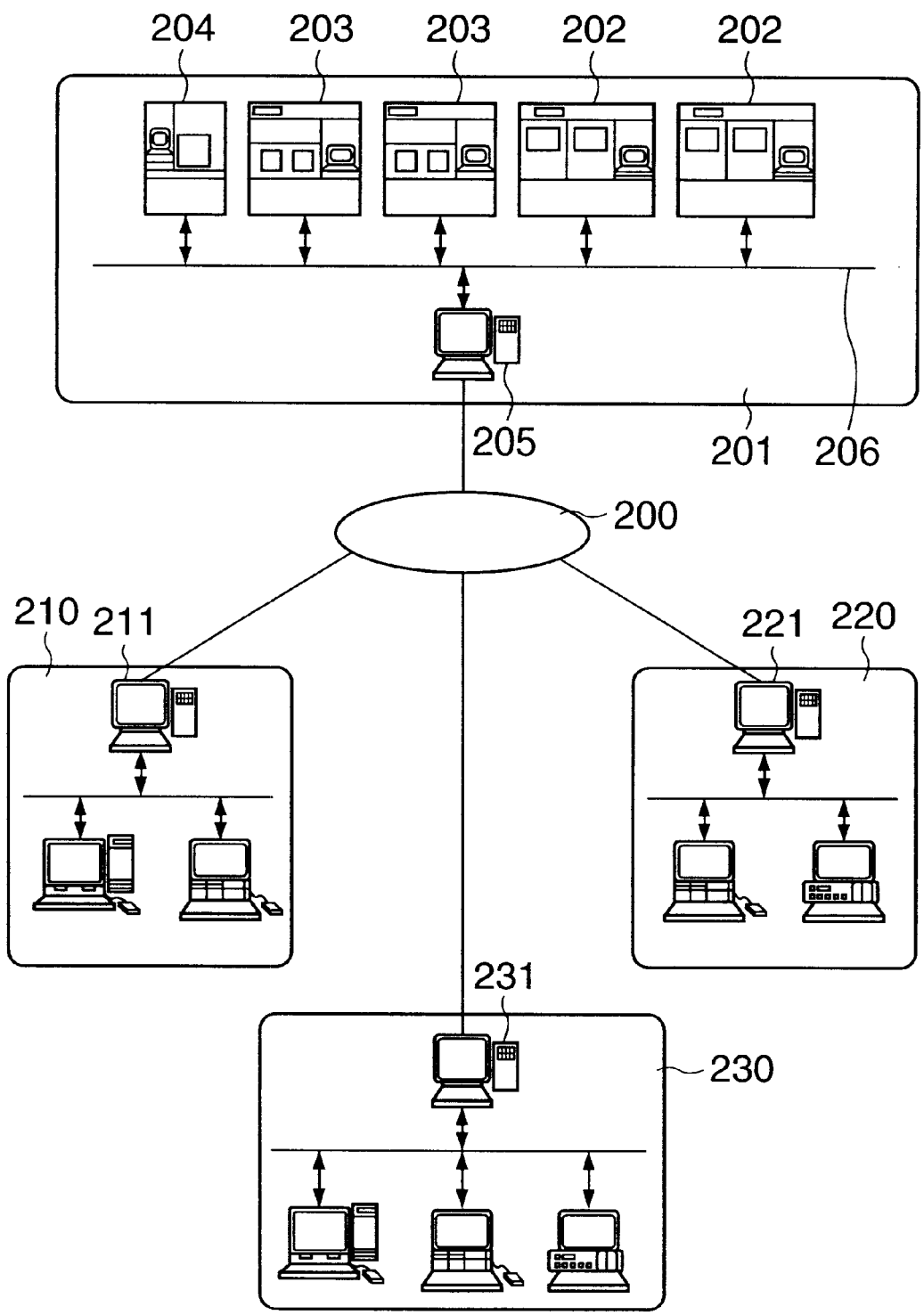
FIG. 21 is a block diagram showing the concept of another semiconductor device production system.

FIG. 21 is a conceptual view showing the overall system of the fourth embodiment that is cut out at a different angle from FIG. 20. In the above example, a plurality of user factories having manufacturing apparatuses and the management system of the manufacturing apparatus vendor are connected via an external network, and production management information of each factory or information of at least one manufacturing apparatus is communicated via the external network. In the example of FIG. 21, a factory having manufacturing apparatuses of a plurality of vendors, and the management systems of the vendors for these manufacturing apparatuses are connected via the external network of the factory, and maintenance information of each manufacturing apparatus is communicated.

In FIG. 21, reference numeral 201 denotes a manufacturing factory of a manufacturing apparatus user (semiconductor device manufacturer) where manufacturing apparatuses for various processes, e.g., an exposure apparatus (charged-particle beam exposure apparatus described in each of the first to third embodiments) 202, resist processing apparatus 203, and film formation apparatus 204 are installed in the manufacturing line of the factory. FIG. 21 shows only one manufacturing factory 201, but a plurality of factories are networked in practice. The respective apparatuses in the factory are connected to a LAN 206 to construct an intranet, and a host management system 205 manages the operation of the manufacturing line.

The business offices of vendors (apparatus supply manufacturers) such as an exposure apparatus manufacturer 210, resist processing apparatus manufacturer 220, and film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated-line network serving as an external network 200. If a trouble occurs in any one of a series of manufacturing apparatuses along the manufacturing line in this system, the operation of the manufacturing line stops. This trouble can be quickly solved by remote maintenance from the vendor of the apparatus in trouble via the external network 200. This can minimize the stop of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 22 on the display. While referring to this window, the operator who manages manufacturing apparatuses in each factory inputs, in input items on the windows, pieces of information such as the type of manufacturing apparatus (401), serial number (402), subject of trouble (403), occurrence date (404), degree of urgency (405), symptom (406), remedy (407), and progress (408). The pieces of input information are transmitted to the maintenance database via the Internet, and appropriate maintenance information is sent back from the maintenance database and displayed on the display.

The user interface provided by the web browser realizes hyperlink functions (410 to 412), as shown in FIG. 22. This allows the operator to access detailed information of each item, receive the latest-version software to be used for a manufacturing apparatus from a software library provided by a vendor, and receive an operation guide (help information) as a reference for the operator in the factory.

Figure 23:
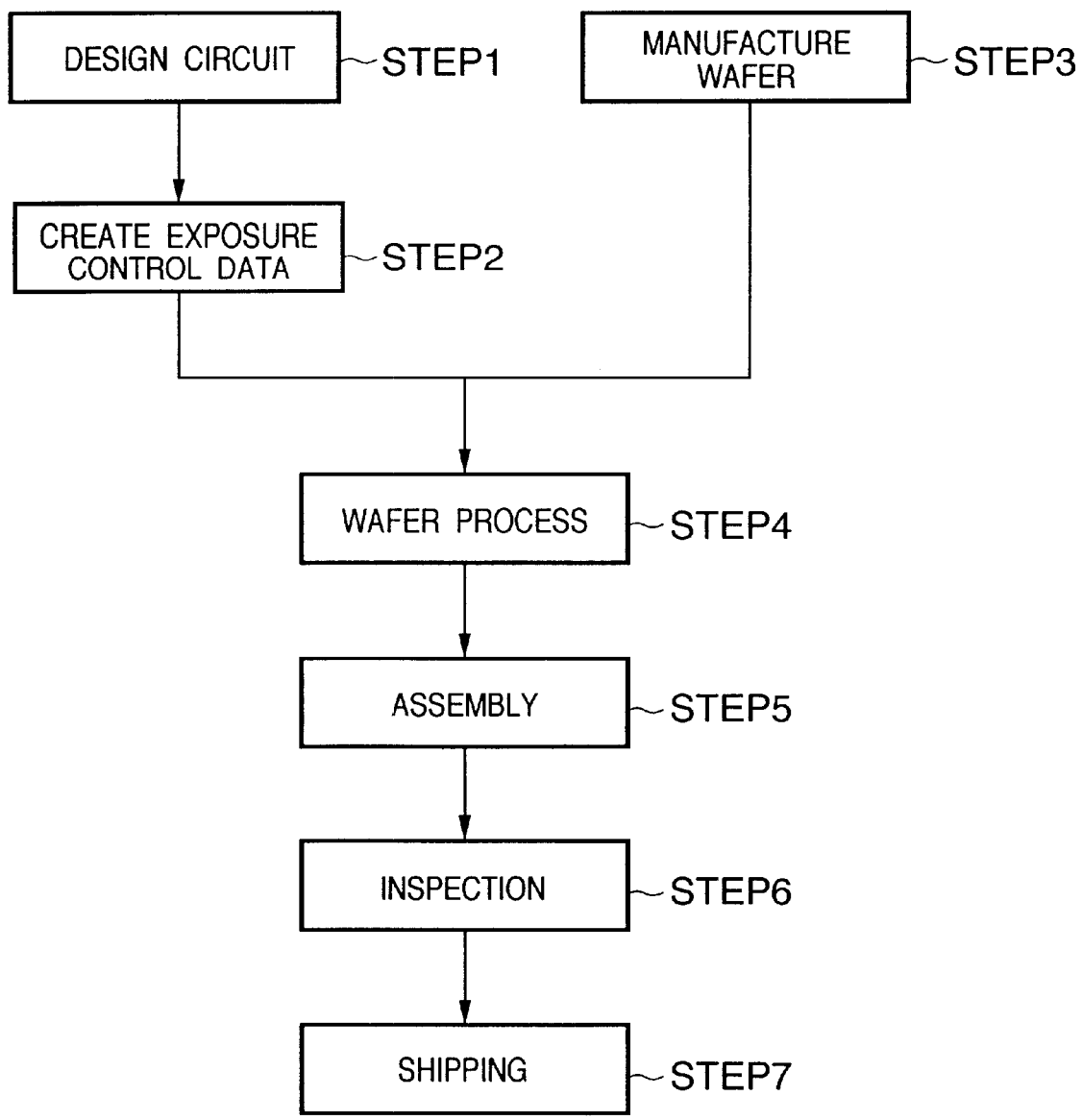
FIG. 23 is a flow chart for explaining the flow of a device manufacturing process.

A manufacturing process for a semiconductor device (semiconductor chip such as an IC or LSI, liquid crystal panel, CCD, thin-film magnetic head, micromachine, or the like) using the above-described production system will be explained. FIG. 23 is a flow chart showing the whole manufacturing process of the semiconductor device.

In step 1 (circuit design), a semiconductor device circuit is designed. In step 2 (creation of exposure control data), exposure control data of the exposure apparatus is created based on the designed circuit pattern. In step 3 (wafer manufacture), a wafer is manufactured using a material such as silicon.

In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and packaging process (chip encapsulation). In step 6 (inspection), inspections such as the operation confirmation test and durability test of the semiconductor device manufactured in step 5 are conducted. After these steps, the semiconductor device is completed and shipped (step 7).

In the fourth embodiment using the production system form described with reference to FIGS. 20 and 21, for example, the pre-process and post-process are executed in separate dedicated factories, and maintenance is done for each of the factories by the above-described remote maintenance system. Information for production management and apparatus maintenance is communicated between the pre-process factory and the post-process factory via the Internet or dedicated-line network.

Figure 24:
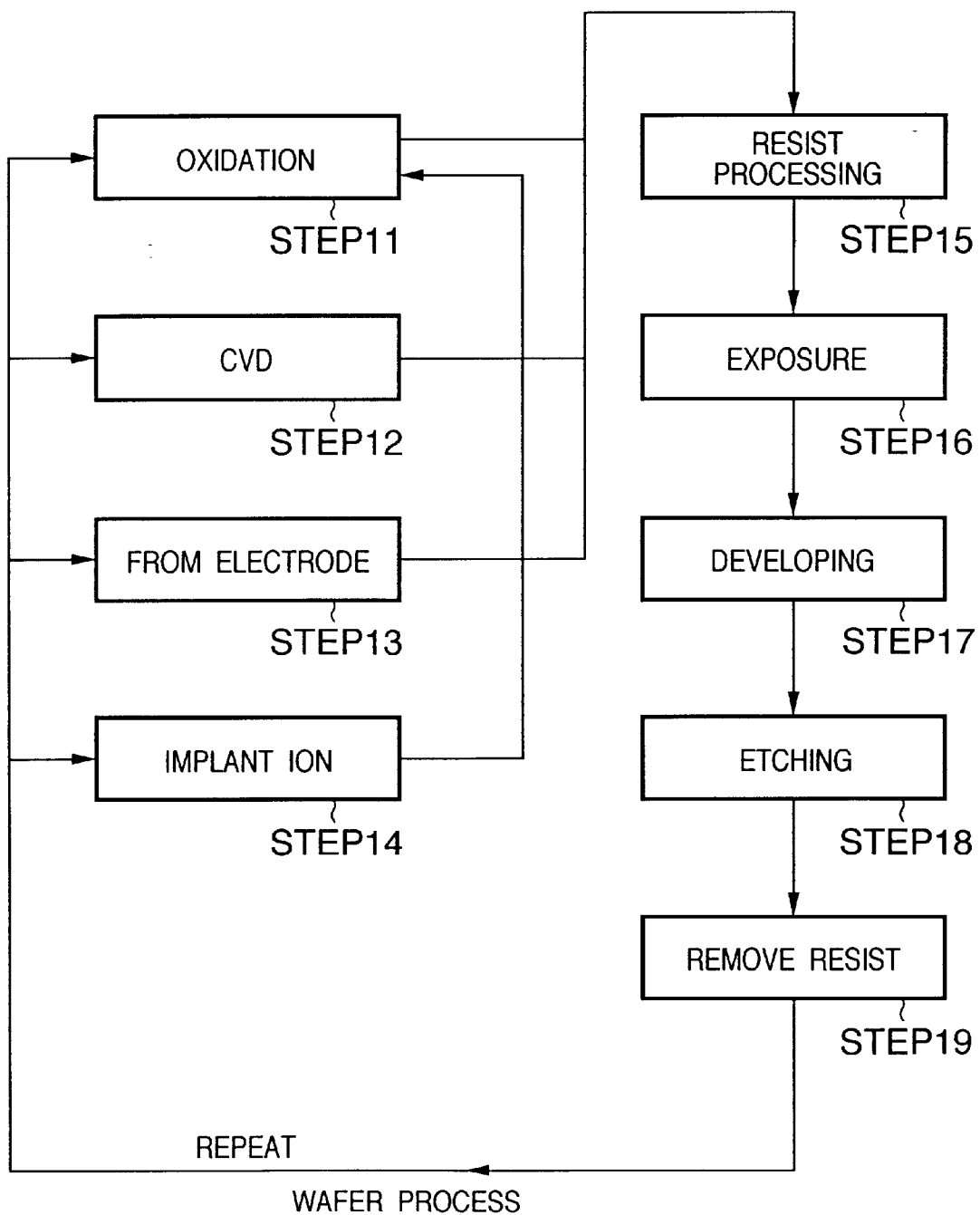
FIG. 24 is a flow chart for explaining a wafer process.
Figure 25:
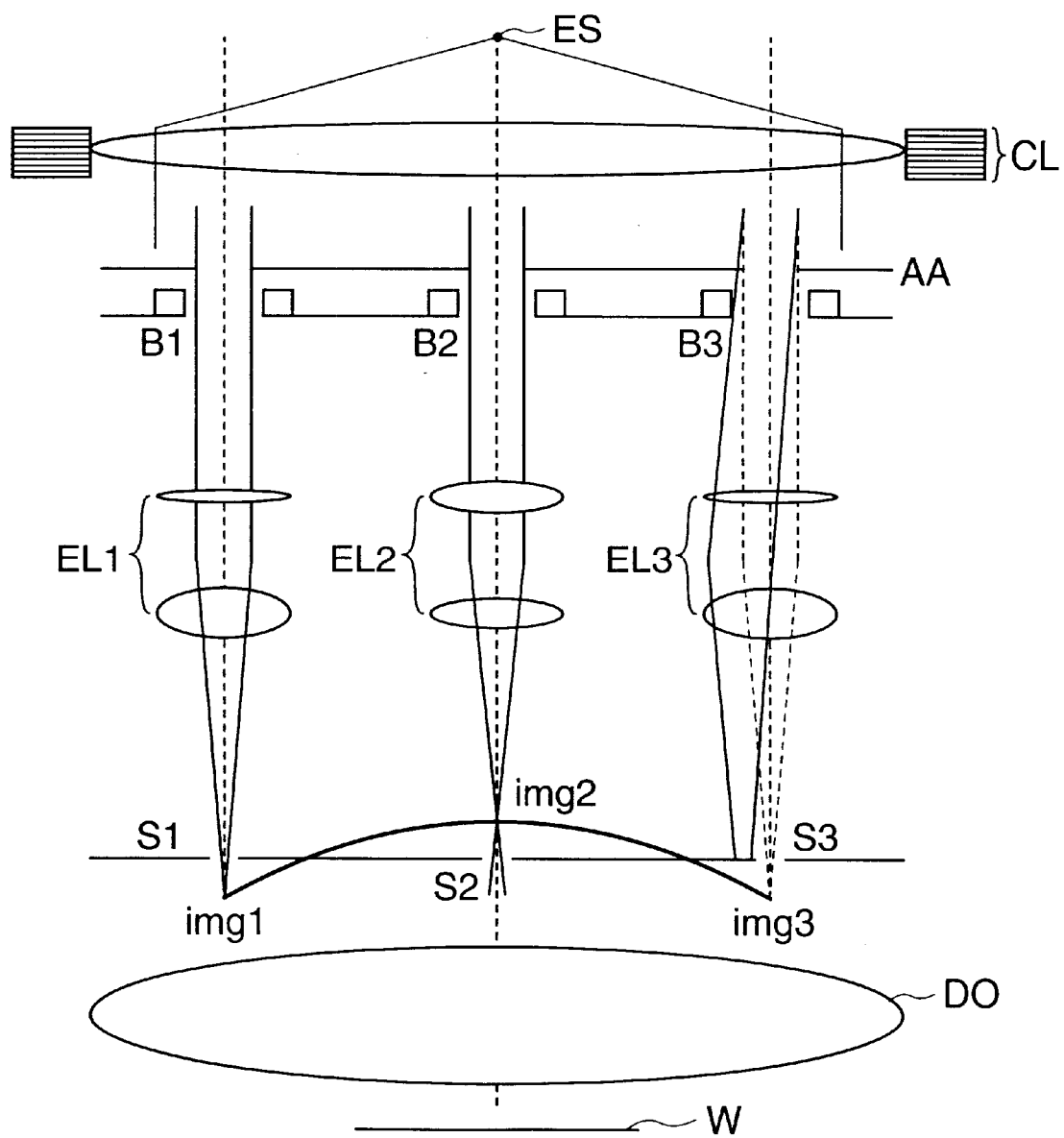
FIG. 25 is a view for explaining a general multi charged-particle beam exposure apparatus.

FIG. 24 is a flow chart showing the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer.

In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

A manufacturing apparatus used in each process undergoes maintenance by the remote maintenance system, which prevents a trouble in advance. Even if a trouble occurs, the manufacturing apparatus can be quickly recovered. The productivity of the semiconductor device can be increased in comparison with the prior art.

Note that the fourth embodiment has exemplified installation of the remote maintenance system. However, the exposure apparatus described in each of the first to third embodiments can also be applied to the production system of one factory which does not use any remote maintenance system.

The present invention can provide a multi charged-particle beam exposure apparatus capable of easily correcting distortion of a projection electrooptic system. A higher-precision device than a conventional device can be obtained by manufacturing the device by using this apparatus.

As many apparently widely different embodiments of the present invention can be made without departing from the spirit and scope thereof, it is to be understood that the invention is not limited to the specific embodiments thereof except as defined in the appended claims.

What is claimed is:

1. A charged-particle beam exposure apparatus for exposing a surface to be exposed by using a plurality of charged-particle beams, comprising:

a charged-particle source for emitting a charged-particle beam;

a substrate having a plurality of apertures;

an irradiation electrooptic system for irradiating said substrate with the charged-particle beam emitted by said charged-particle source;

element electrooptic systems for forming a plurality of intermediate images of said charged-particle source by forming the intermediate images of said charged-particle source by charged-particle beams having passed through the apertures of said substrate;

a projection electrooptic system for projecting the plurality of intermediate images on the surface to be exposed; and adjustment means for adjusting incident angles of the charged-particle beams incident on said element electrooptic systems in order to adjust positions where the plurality of intermediate images are projected on the surface to be exposed.

2. The apparatus according to claim 1, wherein the apparatus further comprises information acquisition means for obtaining information about the positions where the plurality of intermediate images are projected on the surface to be exposed, and said adjustment means adjusts the incident angles of the charged-particle beams incident on said element electrooptic systems on the basis of the information.

3. The apparatus according to claim 1, wherein said adjustment means adjusts the incident angles to move formation positions of the plurality of intermediate images in a direction parallel to a surface perpendicular to an optical axis of said projection electrooptic system.

4. The apparatus according to claim 1, wherein said adjustment means adjusts the incident angles by changing a positional relationship between a front focal position of said irradiation electrooptic system and a position of the charged-particle source.

5. The apparatus according to claim 4, wherein corresponding apertures of said substrate are located at substantially the front focal positions of said element electrooptic systems.

6. The apparatus according to claim 4, wherein said irradiation electrooptic system has a plurality of electron lenses, and said adjustment means changes the front focal position by adjusting electrooptic powers of at least two electron lenses of said irradiation electrooptic system.

7. The apparatus according to claim 4, wherein said adjustment means comprises means for adjusting a magnification of said projection electrooptic system in order to adjust the positions where the plurality of intermediate images are projected on the surface to be exposed via said projection electrooptic system.

8. The apparatus according to claim 4, wherein
the apparatus further comprises information acquisition means for obtaining information about the positions where the plurality of intermediate images are projected on the surface to be exposed via said projection electrooptic system, and
said adjustment means adjusts the positional relationship between the front focal position of said irradiation electrooptic system and the position of the charged-particle source on the basis of the information.

9. The apparatus according to claim 1, wherein
the apparatus further comprises deflectors which are arranged in correspondence with the apertures of said substrate and deflect charged-particle beams from the apertures, and
said adjustment means adjusts the incident angles by deflecting the charged-particle beams by using said deflectors.

10. The apparatus according to claim 9, wherein said deflectors are arranged at substantially front focal positions of corresponding element electrooptic systems.

11. The apparatus according to claim 9, wherein said deflectors function as shielding deflectors for giving shielding deflection amounts to charged particles so as to prevent the charged particles from corresponding intermediate images from being incident on said projection electrooptic system.

12. The apparatus according to claim 9, wherein said charged-particle source is located at a front focal position of said irradiation electrooptic system.

13. The apparatus according to claim 9, wherein
the apparatus further comprises information acquisition means for obtaining information about the positions where the plurality of intermediate images are projected on the surface to be exposed via said projection electrooptic system, and
said adjustment means determines deflection amounts given to the charged-particle beams by said deflectors on the basis of the information.

14. The apparatus according to claim 1, wherein
the apparatus further comprises deflectors which are arranged in accordance with the apertures of said substrate and deflect charged-particle beams from the apertures, and
said adjustment means comprises
first adjustment means for adjusting the incident angles by changing a positional relationship between a front focal position of said irradiation electrooptic system and a position of said charged-particle source; and
second adjustment means for adjusting the incident angles by deflecting charged-particle beams by using said deflectors.

15. The apparatus according to claim 14, wherein
the apparatus further comprises information acquisition means for obtaining information about the positions where the plurality of intermediate images are projected on the surface to be exposed via said projection electrooptic system, and
said adjustment means determines adjustment amounts by said first and second adjustment means on the basis of the information.

16. The apparatus according to claim 14, wherein
the apparatus further comprises information acquisition means for obtaining information about the positions where the plurality of intermediate images are projected on the surface to be exposed via said projection electrooptic system, and
said adjustment means executes said first adjustment means on the basis of the information, newly acquires information from said information acquisition means after execution of said first adjustment means, and executes said second adjustment means on the basis of the newly acquired information.

17. A method of controlling a charged-particle beam exposure apparatus which comprises
a charged-particle source for emitting a charged-particle beam,
a substrate having a plurality of apertures,
an irradiation electrooptic system for irradiating the substrate with the charged-particle beam emitted by the charged-particle source,
element electrooptic systems for forming a plurality of intermediate images of the charged-particle source by forming the intermediate images of the charged-particle source by charged-particle beams having passed through the apertures of the substrate, and
a projection electrooptic system for projecting the plurality of intermediate images on the surface to be exposed, and
which exposes a surface to be exposed by using a plurality of charged-particle beams, comprising:
the information acquisition step of obtaining information about positions where the plurality of intermediate images are projected on the surface to be exposed; and
the adjustment step of adjusting incident angles of the charged-particle beams incident on the element electrooptic systems in order to adjust the positions where the plurality of intermediate images are projected on the surface to be exposed.

18. The method according to claim 17, wherein the adjustment step comprises the step of adjusting the incident angles to move formation positions of the plurality of intermediate images in a direction parallel to a surface perpendicular to an optical axis of the projection electrooptic system.

19. The method according to claim 17, wherein the adjustment step comprises the step of adjusting the incident angles by changing a positional relationship between a front focal position of the irradiation electrooptic system and a position of the charged-particle source.

20. The method according to claim 19, wherein corresponding apertures of the substrate are located at substantially the front focal positions of the element electrooptic systems.

21. The method according to claim 19, wherein
the irradiation electrooptic system has a plurality of electron lenses, and
the adjustment step comprises the step of changing the front focal position by adjusting electrooptic powers of at least two electron lenses of the irradiation electrooptic system.

22. The method according to claim 19, wherein the adjustment step comprises the step of adjusting a magnification of the projection electrooptic system in order to adjust the positions where the plurality of intermediate images are projected on the surface to be exposed via the projection electrooptic system.

23. The method according to claim 19, wherein the adjustment step comprises the step of adjusting the positional relationship between the front focal position of the irradiation electrooptic system and the position of the charged-particle source on the basis of the information acquired in the information acquisition step.

24. The method according to claim 17, wherein
deflectors for deflecting charged-particle beams from the apertures are arranged in correspondence with the apertures of the substrate, and
the adjustment step comprises the step of adjusting the incident angles by deflecting the charged-particle beams by using the deflectors.

25. The method according to claim 24, wherein the deflectors are arranged at substantially front focal positions of corresponding element electrooptic systems.

26. The method according to claim 24, wherein the deflectors function as shielding deflectors for giving shielding deflection amounts to charged particles so as to prevent the charged particles from corresponding intermediate images from being incident on the projection electrooptic system.

27. The method according to claim 24, wherein the charged-particle source is located at a front focal position of the irradiation electrooptic system.

28. The method according to claim 24, wherein the adjustment step comprises the step of determining deflection amounts given to the charged-particle beams by the deflectors on the basis of the information acquired in the information acquisition step.

29. The method according to claim 17, wherein
deflectors for deflecting charged-particle beams from the apertures are arranged in accordance with the apertures of the substrate, and
the adjustment step comprises
the first adjustment step of adjusting the incident angles by changing a positional relationship between a front focal position of the irradiation electrooptic system and a position of the charged-particle source; and
the second adjustment step of adjusting the incident angles by deflecting charged-particle beams by using the deflectors.

30. The method according to claim 29, wherein the adjustment step comprises the step of determining adjustment amounts in the first and second adjustment steps on the basis of the information acquired in the information acquisition step.

31. The method according to claim 29, wherein the adjustment step comprises the step of executing the first adjustment step on the basis of the information acquired in the information acquisition step, executing the information acquisition step after execution of the first adjustment step to newly acquire information, and executing the second adjustment step on the basis of the new information.

32. A device manufacturing method comprising the step of manufacturing a device by using the charged-particle beam exposure apparatus defined in claim 1.

33. A device manufacturing method comprising the-steps of:
installing manufacturing apparatuses for processes including the charged-particle beam exposure apparatus defined in claim 1 in a semiconductor manufacturing factory; and
manufacturing a semiconductor device by a plurality of processes using the manufacturing apparatuses.

34. The method according to claim 33, further comprising the steps of:
connecting the manufacturing apparatuses to a local area network; and
communicating information about at least the charged-particle beam exposure apparatus between the local area network and an external network of the semiconductor manufacturing factory.

35. The method according to claim 34, wherein a database provided by a vendor or user of the charged-particle beam exposure apparatus is accessed via the external network to obtain maintenance information of the charged-particle beam exposure apparatus by data communication.

36. The method according to claim 35, wherein production management is performed by data communication between the semiconductor manufacturing factory and another semiconductor manufacturing factory via the external network.

37. A semiconductor manufacturing factory comprising:
manufacturing apparatuses for various processes including the charged-particle beam exposure apparatus defined in claim 1;
a local area network for connecting said manufacturing apparatuses; and
communication means, having a gateway for authorizing access from the local area network to an external network of said factory, for communicating information about at least the charged-particle beam exposure apparatus.

38. A maintenance method for the charged-particle beam exposure apparatus defined in claim 1 that is installed in a semiconductor manufacturing factory, comprising the steps of:
providing a maintenance database connected to the external network of the semiconductor manufacturing factory by a vendor or user of the charged-particle beam exposure apparatus;
authorizing access to the maintenance database from the semiconductor manufacturing factory via the external network; and
transmitting maintenance information accumulated in the maintenance database to the semiconductor manufacturing factory via the external network.

* * * * *

UNITED STATES PATENT AND TRADEMARK OFFICE
CERTIFICATE OF CORRECTION

PATENT NO. : 6,566,664 B2
DATED : May 20, 2003
INVENTOR(S) : Masato Muraki

It is certified that error appears in the above-identified patent and that said Letters Patent is hereby corrected as shown below:

<u>Title page,</u>
Item [22], Filed:, "March 15, 2000" should read -- March 15, 2001 --.

<u>Column 5,</u>
Line 12, "fi" should read -- fl --.

<u>Column 9,</u>
Line 47, "blander" should read -- blanker --.

<u>Column 11,</u>
Line 2, "branker" should read -- blanker --.

<u>Column 12,</u>
Line 51, "lense)." should read -- lens). --.

<u>Column 14,</u>
Line 24, "didually" should read -- individually --.
Line 51, "system)" should read -- system). --.

<u>Column 17,</u>
Lines 54, 60 and 66, "vender" should read -- vendor --.

<u>Column 18,</u>
Line 8, "factors." should read -- factories. --.

Signed and Sealed this

Fourth Day of May, 2004

JON W. DUDAS
*Acting Director of the United States Patent and Trademark Office*